United States Patent
Purayath et al.

(10) Patent No.: US 8,492,224 B2
(45) Date of Patent: Jul. 23, 2013

(54) METAL CONTROL GATE STRUCTURES AND AIR GAP ISOLATION IN NON-VOLATILE MEMORY

(75) Inventors: Vinod Robert Purayath, Santa Clara, CA (US); Tuan Pham, San Jose, CA (US); Hiroyuki Kinoshita, San Jose, CA (US); Yuan Zhang, San Jose, CA (US); Henry Chin, Santa Clara, CA (US); James K. Kai, Santa Clara, CA (US); Takashi W. Orimoto, Sunnyvale, CA (US); George Matamis, San Jose, CA (US); Henry Chien, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 67 days.

(21) Appl. No.: 13/163,538

(22) Filed: Jun. 17, 2011

(65) Prior Publication Data
US 2011/0309426 A1  Dec. 22, 2011

Related U.S. Application Data

(60) Provisional application No. 61/356,630, filed on Jun. 20, 2010.

(51) Int. Cl.
H01L 29/788 (2006.01)
H01L 21/336 (2006.01)
H01L 21/764 (2006.01)

(52) U.S. Cl.
USPC ............................. 438/257; 438/421; 438/591

(58) Field of Classification Search
USPC .............. 438/257–267, 421, 591, 619, E29.3, 438/E21.573, E21.409
See application file for complete search history.

(56) References Cited

U.S. PATENT DOCUMENTS

| 7,737,015 | B2  | 6/2010 | Kohli et al. |
| 7,795,080 | B2* | 9/2010 | Orimoto et al. ............... 438/129 |
| 7,800,155 | B2* | 9/2010 | Matsuno ...................... 257/315 |
| 7,863,190 | B1  | 1/2011 | Papasouliotis et al. |
| 7,884,415 | B2  | 2/2011 | Nagano |
| 7,905,959 | B2  | 3/2011 | Tzu et al. |

(Continued)

FOREIGN PATENT DOCUMENTS

EP  1835530 A2  9/2007

OTHER PUBLICATIONS

Ragunathan, Shyam, et al., "Investigation of Ballistic Current in Scaled Floating-gate NAND FLASH and a Solution," IEEE International Electron Devices Meeting (IEDM), Dec. 2009, pp. 34.1.1-34.1.4.

(Continued)

*Primary Examiner* — Cuong Q Nguyen
(74) *Attorney, Agent, or Firm* — Vierra Magen Marcus LLP

(57) ABSTRACT

High-density semiconductor memory utilizing metal control gate structures and air gap electrical isolation between discrete devices in these types of structures are provided. During gate formation and definition, etching the metal control gate layer(s) is separated from etching the charge storage layer to form protective sidewall spacers along the vertical sidewalls of the metal control gate layer(s). The sidewall spacers encapsulate the metal control gate layer(s) while etching the charge storage material to avoid contamination of the charge storage and tunnel dielectric materials. Electrical isolation is provided, at least in part, by air gaps that are formed in the row direction and/or air gaps that are formed in the column direction.

15 Claims, 21 Drawing Sheets

U.S. PATENT DOCUMENTS

| | | | |
|---|---|---|---|
| 8,053,347 B2 * | 11/2011 | Kang et al. | 438/592 |
| 8,129,264 B2 * | 3/2012 | Kim et al. | 438/619 |
| 8,362,542 B2 * | 1/2013 | Kang et al. | 438/257 |
| 8,383,479 B2 * | 2/2013 | Purayath et al. | 438/258 |
| 2006/0194390 A1 | 8/2006 | Imai et al. | |
| 2007/0184615 A1 | 8/2007 | Brazzelli et al. | |
| 2007/0257305 A1 | 11/2007 | Sasago et al. | |
| 2008/0003743 A1 | 1/2008 | Lee | |
| 2008/0283898 A1 | 11/2008 | Kuniya | |
| 2009/0212352 A1 | 8/2009 | Aoyama et al. | |
| 2009/0267131 A1 | 10/2009 | Nitta | |
| 2010/0019311 A1 | 1/2010 | Sato et al. | |
| 2010/0127320 A1 | 5/2010 | Nishihara et al. | |
| 2010/0230741 A1 | 9/2010 | Choi et al. | |
| 2011/0057250 A1 | 3/2011 | Higashi | |

OTHER PUBLICATIONS

Ragunathan, Shyam, et al., "Investigation of Ballistic Current in Scaled Floating-gate NAND FLASH and a Solution," Powerpoint Presentation, IEEE International Electron Devices Meeting (IEDM), Dec. 2009, pp. 1-38.
U.S. Appl. No. 13/157,178, filed Jun. 9, 2011.
U.S. Appl. No. 13/162,550, filed Jun. 16, 2011.
U.S. Appl. No. 13/162,475, filed Jun. 16, 2011.

* cited by examiner

FIG. 1
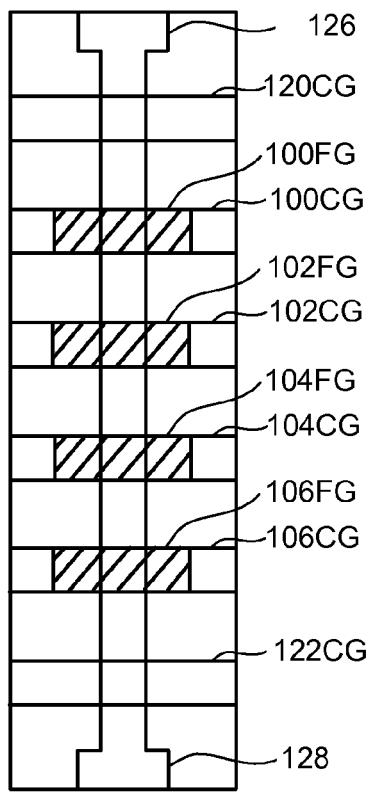
FIG. 2
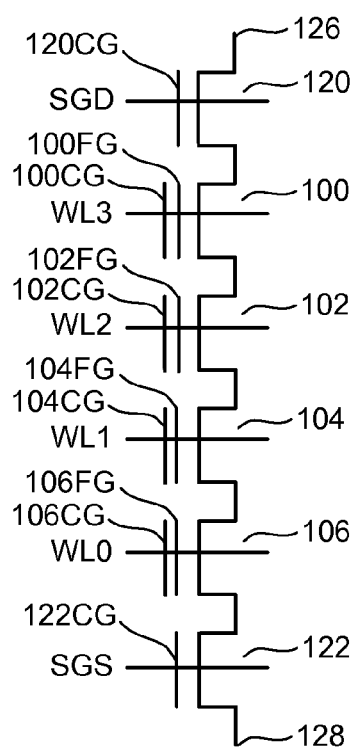
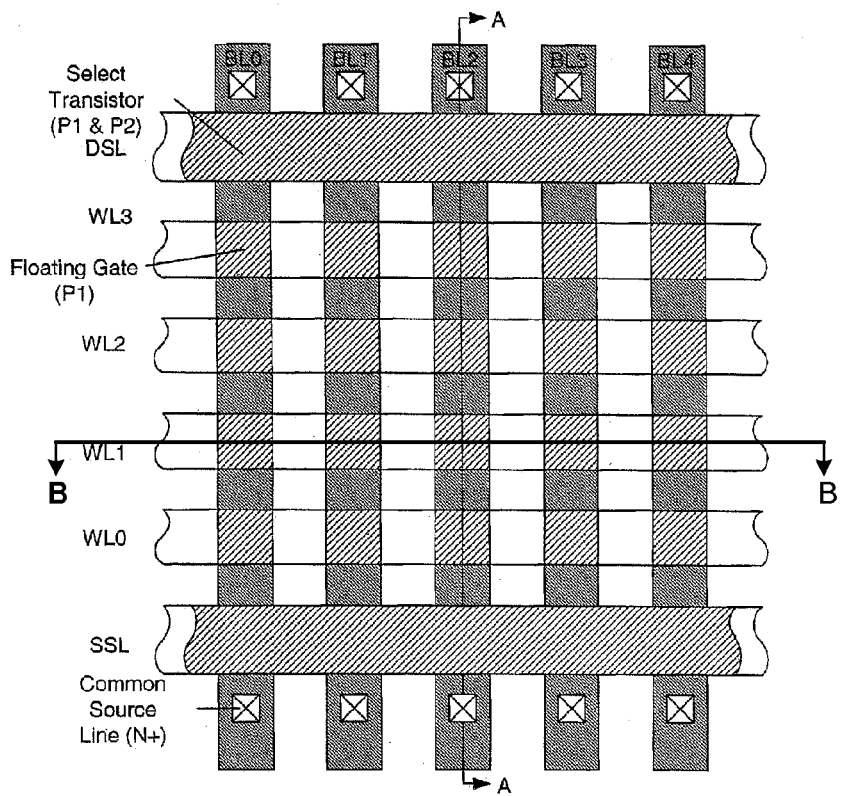
FIG. 3

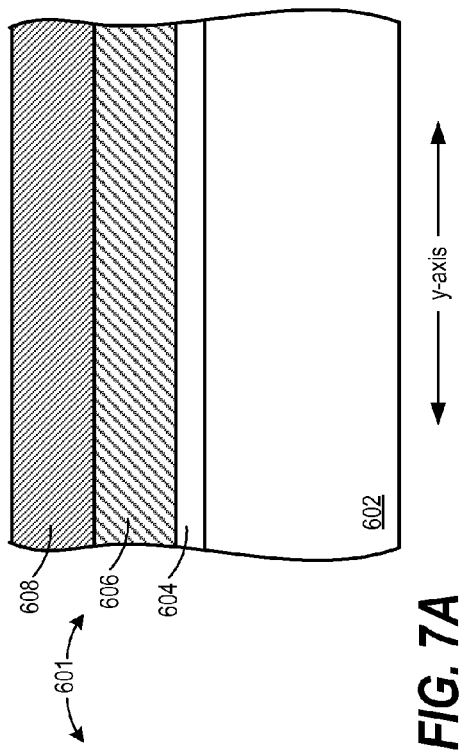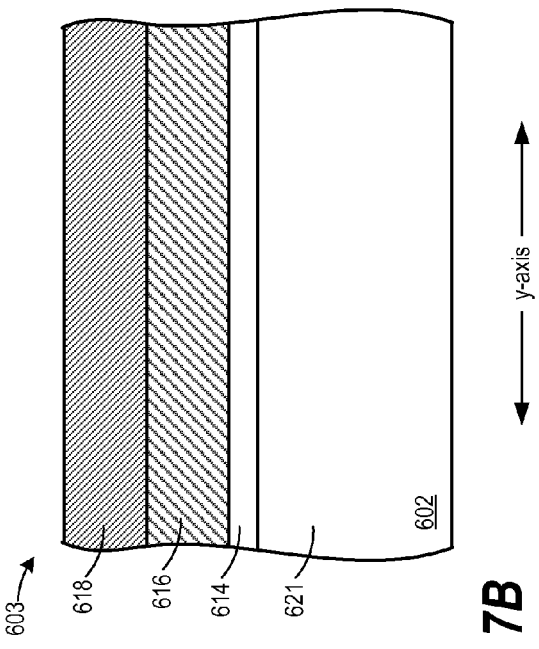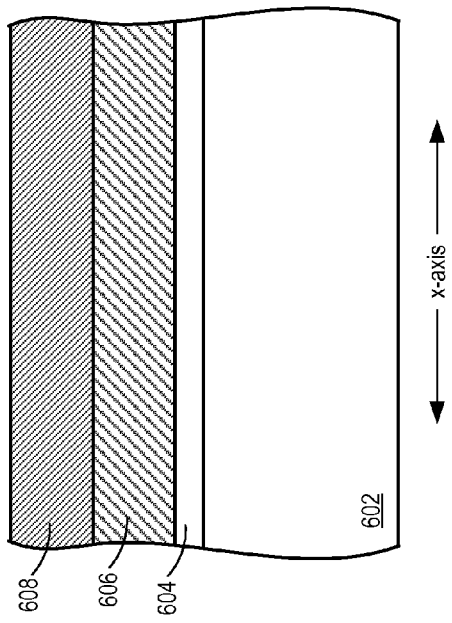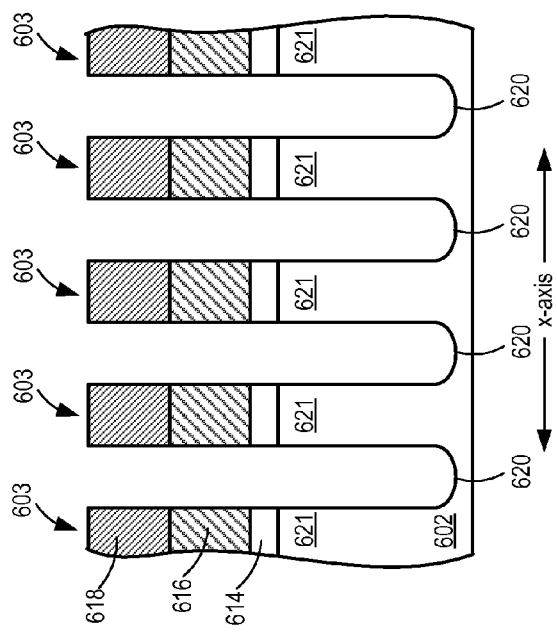
FIG. 7A
FIG. 7B

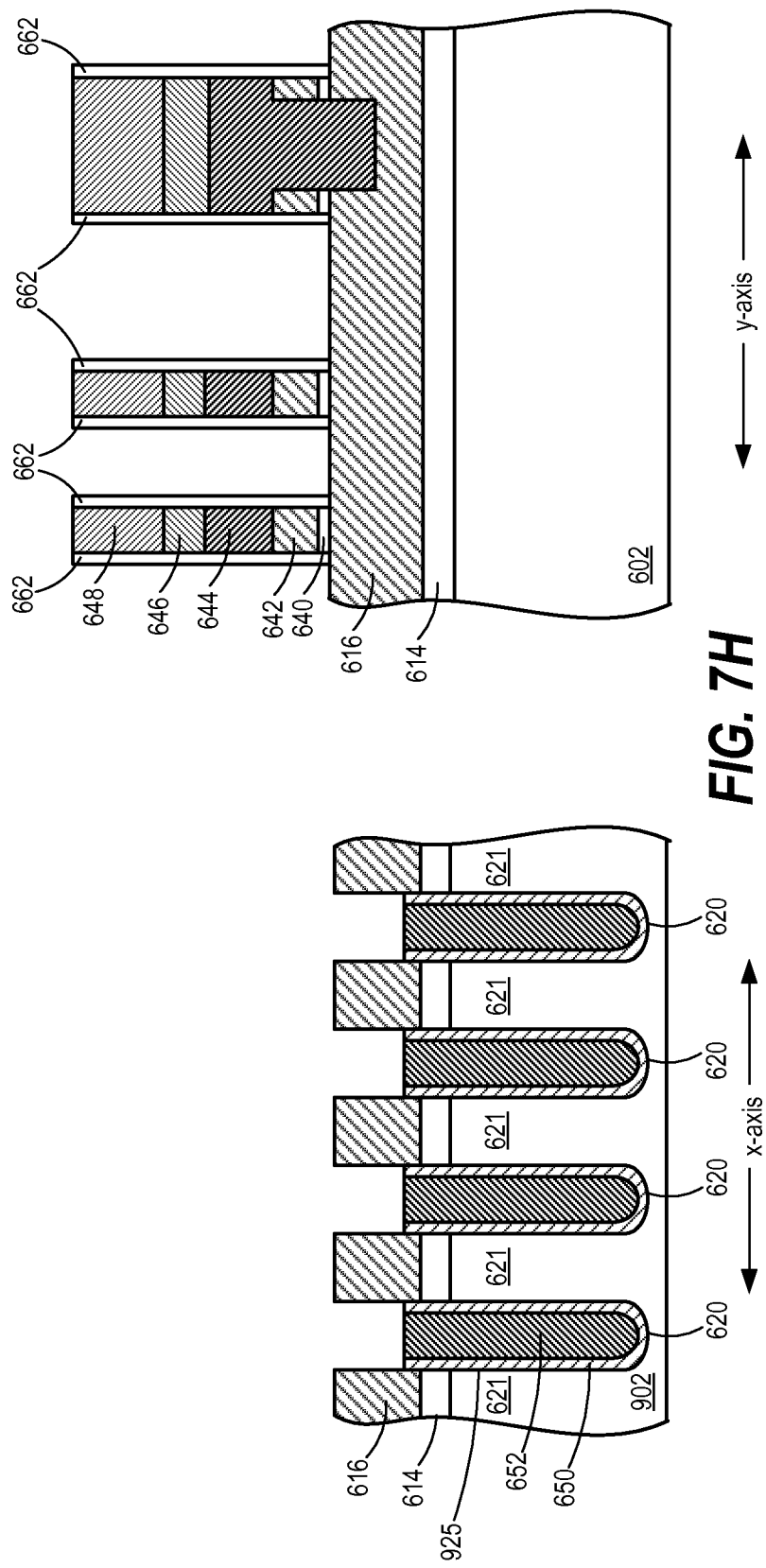

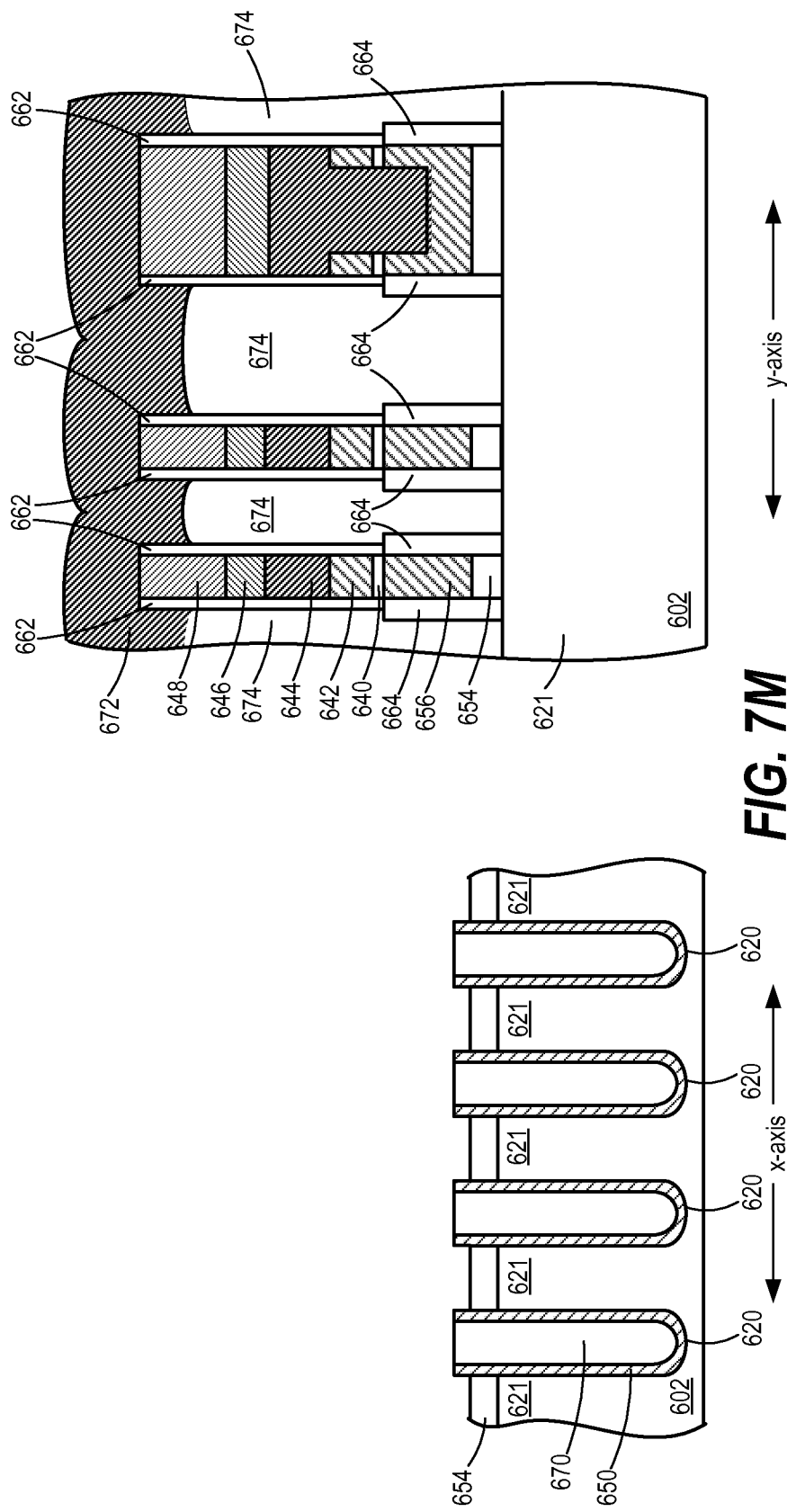

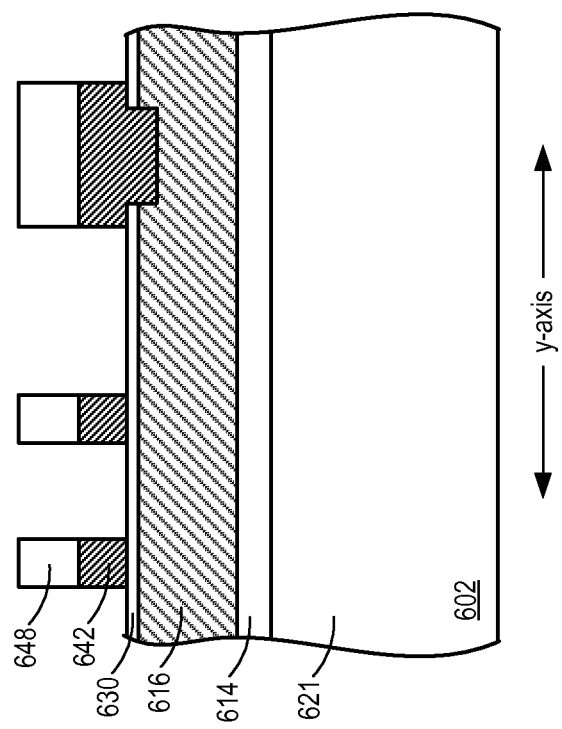
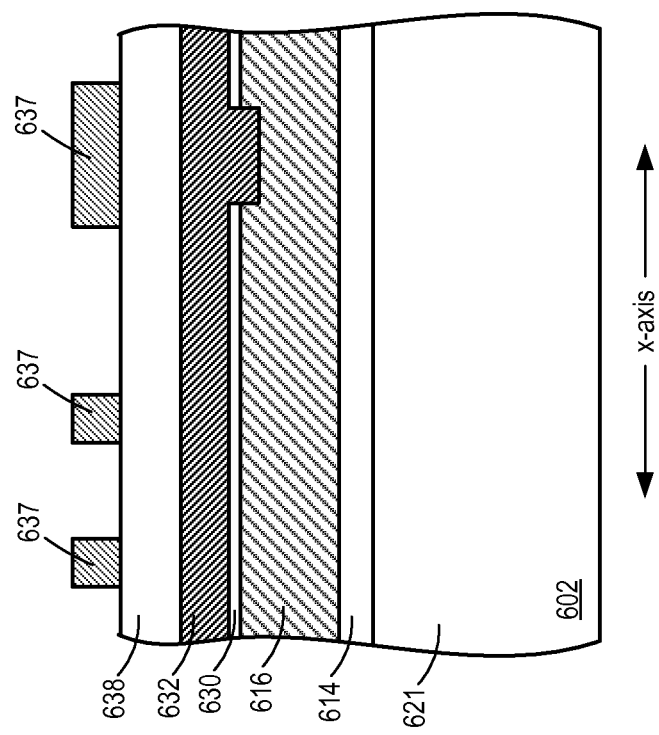

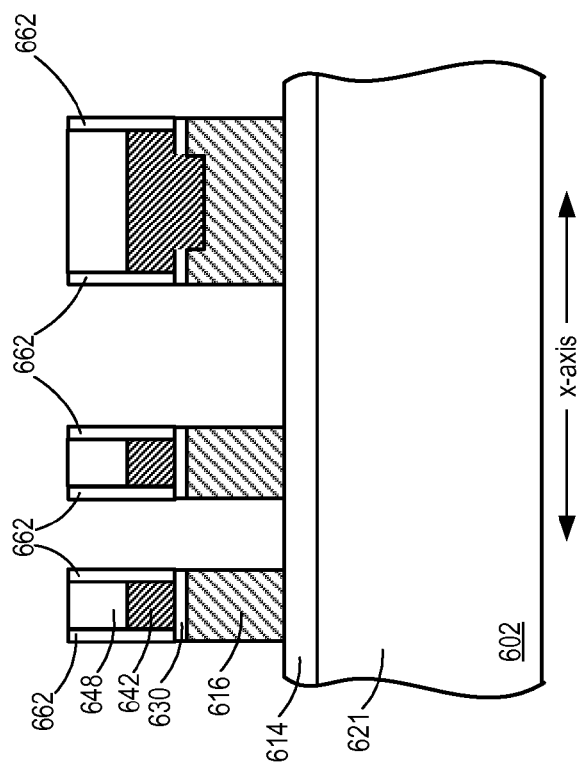
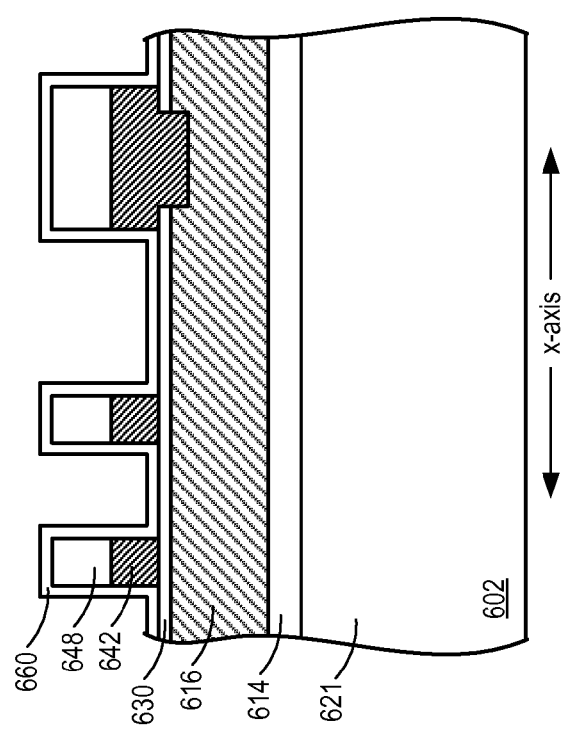

US 8,492,224 B2

METAL CONTROL GATE STRUCTURES AND AIR GAP ISOLATION IN NON-VOLATILE MEMORY

The present application claims priority from U.S. Provisional Patent Application No. 61/356,630, entitled "Air Gap Isolation in Semiconductor Devices," by Purayath, et al., filed Jun. 20, 2010, incorporated by reference herein in its entirety.

BACKGROUND OF THE INVENTION

1. Field of the Disclosure

Embodiments of the present disclosure are directed to high density semiconductor devices, such as non-volatile storage, and methods of forming the same.

2. Description of the Related Art

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of typical non-volatile flash arrays are divided into discrete blocks of cells that are erased together. That is, the block contains the minimum number of cells that are separately erasable together as an erase unit, although more than one block may be erased in a single erase operation. Additionally, more recent memories may provide erasing in smaller units than blocks. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. As the feature sizes have decreased, modifications to the traditional NAND memory array have been made to, among other things, decrease parasitic capacitances associated with small feature sizes.

BRIEF DESCRIPTION OF THE DRAWINGS

FIG. 1 is a top view of a NAND string.

FIG. 2 is an equivalent circuit diagram of the NAND string depicted in FIG. 1.

FIG. 3 is a plan view of a portion of a NAND flash memory array.

FIGS. 7A-7M are cross-sectional and perspective views through a portion of a non-volatile memory array that may be fabricated according to the method of FIG. 6 in one embodiment.

FIGS. 9A-9E are cross-sectional views showing a gate formation process with air gap formation in one embodiment.

DETAILED DESCRIPTION

Figure 4:
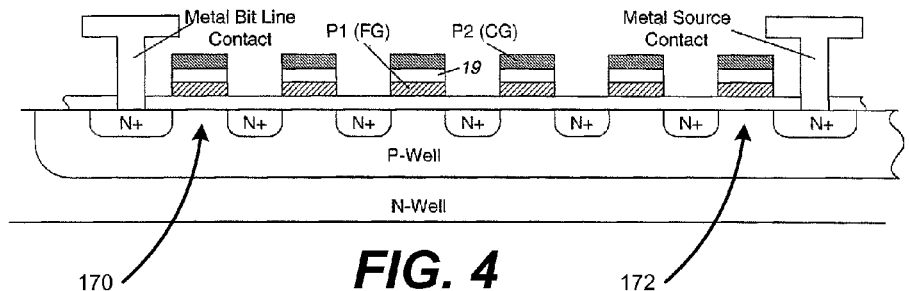
FIG. 4 is an orthogonal cross-sectional view taken along line A-A of the portion of the flash memory array depicted in FIG. 3.

Embodiments of the present disclosure are directed to high-density semiconductor memory, and more particularly to memory utilizing metal control gate structures and electrical isolation between discrete devices in these types of structures. During gate formation and definition, etching the metal control gate layer(s) is separated from etching the charge storage layer so that protective sidewall spacers can be formed along the vertical sidewalls of the metal control gate layer(s). The charge storage layer is then etched to form individual charge storage regions while the sidewall spacers protect the metal control gate layer(s). By encapsulating the metal layer(s) prior to etching the charge storage layer, contamination of the charge storage and tunnel dielectric materials can be avoided. Additionally, cleans or traditional oxidation techniques may later be avoided so as to avoid damaging the tunnel dielectric material.

In one embodiment, electrical isolation is provided, at least in part, by air gaps that are formed in the row (word line) direction and or air gaps that are formed in the column (bit line) direction. Non-volatile memory arrays and related methods of fabrication are provided.

Air gaps can decrease parasitic interferences between neighboring charge storage regions (e.g., floating gates), neighboring control gates and/or between neighboring floating and control gates. Air gaps can replace traditional oxide materials having a dielectric constant of about 3.9 with air having a lower dielectric constant of about 1, for example. A low conformal oxide film can be used, such as low temperature TEOS, PECVD silane oxide, HDP films to form air gaps. Air gaps can include various material compositions and need not correspond to atmospheric air. For example, concentrations of elemental gases may vary in the air gap regions. An air gap is simply a void where no solid material is formed in the semiconductor structure.

The air gaps formed in the row direction, referred to as word line air gaps, can provide electrical isolation between devices adjacent in the column direction. For example, adjacent rows of non-volatile storage elements such as the non-volatile storage elements associated with adjacent word lines in a NAND type non-volatile memory can be isolated using air gaps that are formed above the substrate between adjacent rows of storage elements. The dimensions of the word line air gaps may vary according to the specifications for individual implementations. In one embodiment, the word line air gaps are formed entirely above the substrate surface. These air gaps may extend above the surface of the substrate to at least partially occupy the area between adjacent rows of storage elements.

In one embodiment, the lower portions of the word line air gaps extend to the level of the substrate surface. In another embodiment, the lower portions only extend to the level of the upper surface of the tunnel dielectric layer. The upper portions of the word line air gaps may extend any desired distance above the substrate surface. In one example, the air gaps extend vertically above the substrate surface to a level above the upper surface of the control gates. A pad or other layer formed over each control gate may provide a formation point for a capping layer so that the air gaps extend above the upper surface of the control gates to avoid fringing fields and the like.

In the column direction, the word line air gaps may extend the full distance between adjacent rows of storage elements or some portion thereof, for example where a liner, spacer or partial dielectric fill is used. In the row direction, the word line air gaps may extend the length of a row of storage elements, such as may be formed for a block of NAND non-volatile storage elements. Each non-volatile storage element of a row may be coupled to a common word line. The air gaps may extend beyond an entire row or less than the entire length of a row.

The air gaps formed in the column direction, referred to as bit line air gaps, can provide electrical isolation between devices adjacent in the row direction. For example, adjacent columns of non-volatile storage elements, such as adjacent strings in a NAND type non-volatile memory, can be isolated using air gaps that are formed in the substrate between active areas underlying the adjacent columns. Although principally described with respect to NAND type non-volatile memory, it will be understood that the various air gaps and metal control gate structures described herein can be utilized in other arrays utilizing column and/or row arrangements for storage elements.

A portion of a NAND memory array as can be fabricated in accordance with an embodiment of the present disclosure is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon. FIG. 4 is a cross-sectional view taken along line A-A of FIG. 3, depicting polysilicon layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL. The floating gate material (P1) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774, 397 and 6,046,935.

Figure 5:
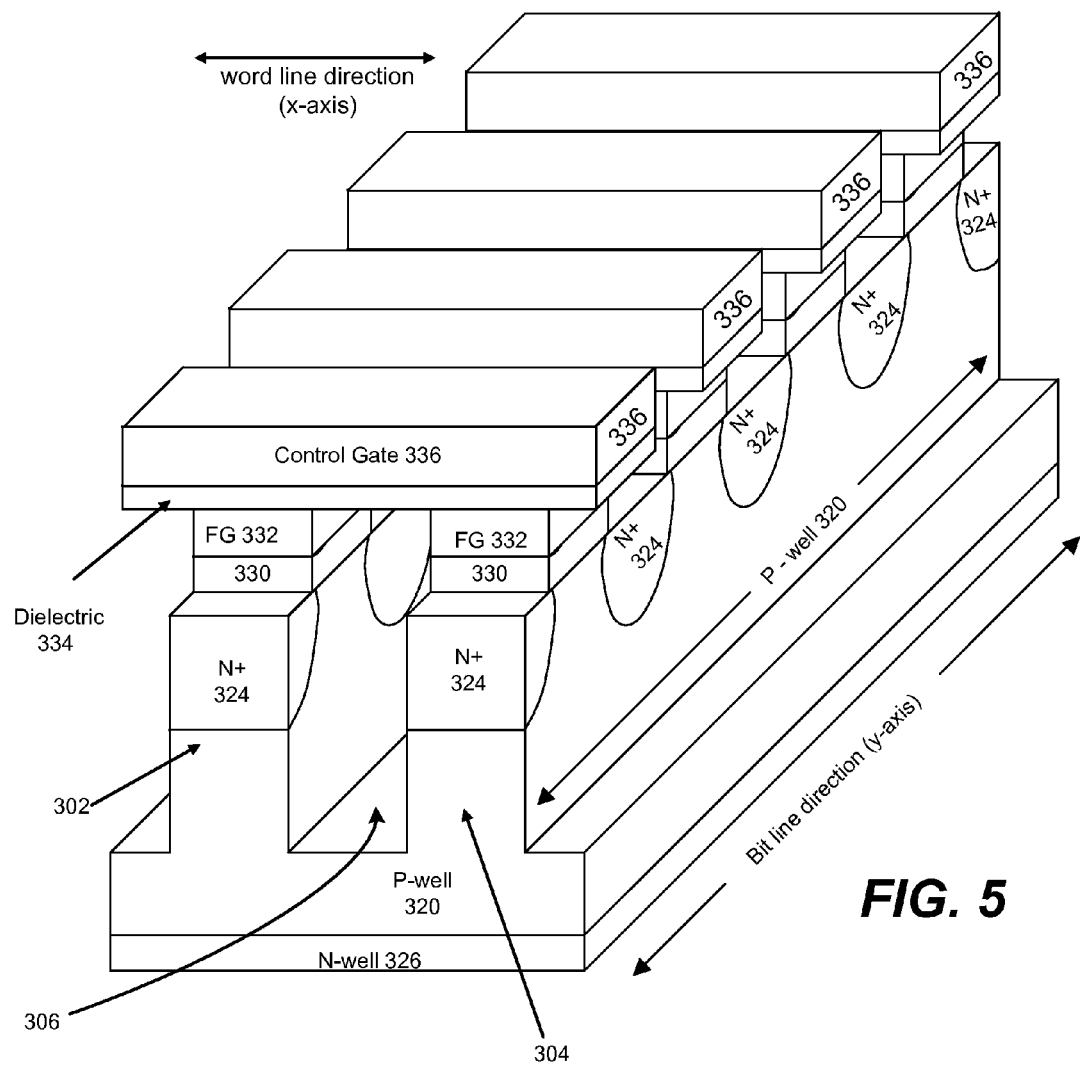
FIG. 5 is a three-dimensional drawing of a pair of four word line long portions of two NAND strings.

FIG. 5 is a three-dimensional block diagram of two exemplary NAND strings 302 and 304 that may be fabricated as part of a larger flash memory array. FIG. 5 depicts four memory cells on strings 302 and 304 as an example. FIG. 5 depicts N-well 326 below P-well 320. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 326 is not shown in FIG. 5. In one embodiment, the control gates form the word lines. A continuous layer of conductive layer 336 can be formed which is consistent across a row in order to provide a common word line or control gate for each device on that word line. In such a case, this layer can be considered to form a control gate for each memory cell at the point where the layer overlaps a corresponding floating gate layer 332. In other embodiments, individual control gates can be formed and then interconnected by a separately formed word line.

When fabricating a NAND-type non-volatile memory system, including NAND strings as depicted in FIG. 5, electrical isolation is provided in the word line direction between adjacent strings. In the embodiment depicted in FIG. 5, NAND string 302 is separated from NAND string 304 by isolation area 306. Typically, an insulating material or dielectric is formed between adjacent NAND strings in this isolation area.

High dielectric constant (K) materials are used (e.g., for the intermediate dielectric material) in one embodiment. High K materials can enhance coupling between the control gates and floating gates. A self-aligned high-K approach is utilized in one embodiment to reduce or eliminate charge transfer through the intermediate dielectric material. Incorporation of thin metal/charge-trap type floating gates are used in one embodiment to reduce or eliminate concerns with ballistic charge programming issues that may exist with conventional polysilicon floating gates.

In accordance with embodiments of the disclosure, metal control gate structures are provided that avoid cross-contamination with other layers during the fabrication process. Cross-contamination of metal by-products on structures such as polysilicon floating gates is avoided, while also avoiding processes which may damage the tunnel dielectric material. The metal control gate structure is incorporated with a word line air gap, having an upper endpoint positioned at or above the control gate level, to further provide electrical isolation in one embodiment.

Figure 6:
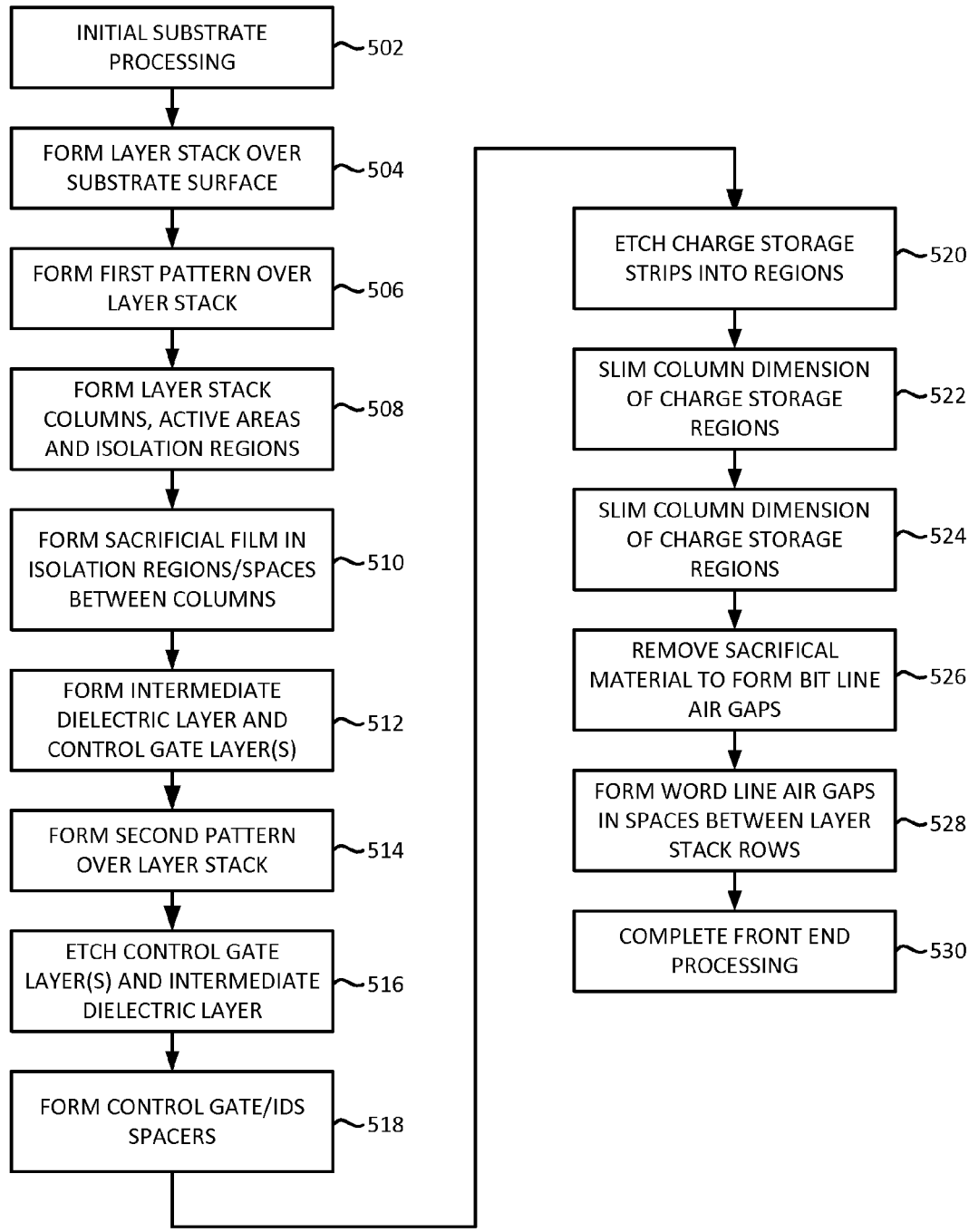
FIG. 6 is a flowchart describing a method of forming metal control gate structures and word line air gaps in one embodiment.

FIG. 6 is a flowchart describing a method of fabricating non-volatile storage using at least one metal control gate layer in accordance with an embodiment. FIGS. 7A-7J are orthogonal cross-sectional and perspective views of an embodiment of a non-volatile memory array that can be fabricated according to the method in FIG. 6. The described embodiment is exemplary only and its precise form should not be taken as limiting the disclosure. The exact materials, dimensions and order of processing may vary according to the requirements of a given implementation. It is noted that the dimensions of the various features are not necessarily drawn to scale.

At step 502, initial processing is performed to prepare a substrate for memory fabrication. One or more wells (e.g., a triple well) are typically formed in the substrate prior to forming a layer stack over the substrate surface. For example, a p-type substrate may be used. Within the p-type substrate, an n-type well may be created and within the n-type well a p-type well may be created. Various units of a memory array may be formed within individual p-type wells. The well(s) can be implanted and annealed to dope the substrate. A zero layer formation step may also precede well formation.

At step 504, an initial layer stack is formed over the substrate surface. FIG. 7A depicts orthogonal cross-sectional views in both the x-axis (row) and y-axis (column) direction, showing the results of steps 502-504 in one embodiment. The depiction in the direction of the x-axis is taken through the array along a line like that of line B-B shown in FIG. 3 and the depiction in the direction of the y-axis is taken through the array along a line like that of line A-A in FIG. 3. A layer stack 601 is formed over the surface of substrate 602. In this example, layer stack 601 includes a tunnel dielectric layer (TDL) 604, a charge storage layer (CSL) 606, and one or more hard mask layers 608 (e.g., oxide). One or more sacrificial layers may be formed between the charge storage layer 606 and hard masking layer(s) 608 in one embodiment. It is noted that a layer may be said to be over another layer when one or more layers are between the two layers as well as when the two layers are in direct contact.

The tunnel dielectric layer 604 is a thin layer of oxide (e.g., $SiO_2$) grown in one embodiment, although different materials and processes can be used. Chemical vapor deposition (CVD) processes, metal organic CVD processes, physical vapor deposition (PVD) processes, atomic layer deposition (ALD) processes, thermal oxidation or other suitable techniques can be used. In one example, the tunnel oxide layer is formed to a thickness of about 8 nanometers (nm). Although not shown, one or more high voltage gate dielectric regions may be formed at a peripheral circuitry region before or after forming the tunnel dielectric layer. The high voltage gate dielectric regions may be formed with a larger thickness (e.g., 30-40 nm) than the tunnel dielectric layer.

The charge storage layer 606 is a polysilicon floating gate layer in one embodiment. The vertical dimension (with respect to the substrate surface) or thickness of the charge storage layer can vary by embodiment. In one example, the charge storage layer has a vertical dimension of 30 nm. In another example, the charge storage layer has a vertical dimension of 70-80 nm.

Dielectric charge storage materials, metal and non-metal nanostructures (e.g., carbon) can also be used for the layer of charge storage material. In one embodiment, the charge storage layer is a metal layer forming a charge-trap type floating gate layer. A thin metal charge-trap type floating gate can reduce concerns with ballistic charge programming issues that may arise with conventional polysilicon floating gates. In one embodiment, a metal floating gate layer is formed to a thickness of between 10 nm and 20 nm. In another embodiment, metal thicknesses greater than 20 nm or less than 10 nm are used. In one embodiment, the metal floating gate layer is a high work function metal. In one example, the metal is ruthenium. Other metals such as titanium, tungsten, tantalum, nickel, cobalt, etc., and their alloys (e.g., TiN, WN, TaN, NiSi, CoSi, WSix) can be used.

The layer stack is patterned at step 506. The first pattern applied at step 506 corresponds to intended columns of the memory array and may be repetitive in the row or direction of the x-axis. The pattern also corresponds to intended active areas of the substrate which will be separated by isolation regions. In one embodiment, conventional photolithography using photoresist is used to pattern the hard mask layer 608 into strips elongated in the direction of the y-axis with spaces between strips adjacent in the direction of the x-axis. The hard mask layer may be patterned into a first sub-pattern at the memory array area and one or more different sub-patterns at the peripheral circuitry areas to define active areas in the substrate with different dimensions in the direction of the x-axis. Spacer-assisted patterning, nano-imprint patterning, and other patterning techniques can also be used to form strips of the hard mask layer at reduced features sizes. The pattern, repetitive in the second or row direction, may define a first direction of etching to form columns of the targeted memory array.

After forming the pattern, the layer stack and substrate are etched at step 508 using the pattern formed at step 506. The layer stack is etched into layer stack columns and the substrate is etched into active areas which underlie the columns and isolation regions which separate the active areas. The term layer stack is used to refer to the layers formed over the substrate throughout processing. Thus, layer stack 601 may refer to the collection of layer stack columns that result from etching the initial layer stack.

FIG. 7B depicts the memory array after etching in one example. Etching forms layer stack columns 603 that are elongated in the direction of the y-axis with spaces therebetween in the direction of the x-axis. The depiction in the direction of the x-axis shows multiple layer stack columns 603 overlying active areas 621 which are separated by isolation regions 620. The depiction in the direction of the y-axis shows a single layer stack column 603 overlying an active area 621. Each layer stack column 603 includes a tunnel dielectric strip (TDS) 614, a charge storage strip (CSS) 616, and a hard mask strip (HMS) 618. Etching continues into substrate 602 to form isolation trenches 620 and active areas 621. In one example, the depth of the isolation regions in the substrate is 200 nm. Various depths can be used, for example, ranging from 180-220 nm in one example. In one embodiment, reactive ion etching is used with various combinational etch chemistries to etch the different layers. Any suitable etch process(es) can be used.

Figure 7C:
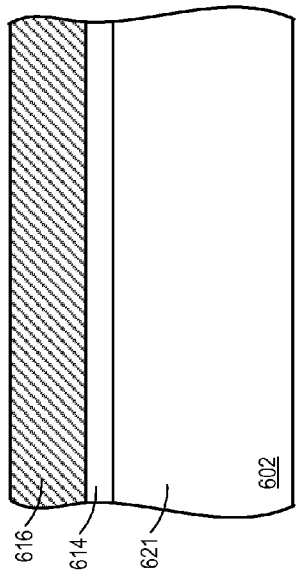
Figure 7C:
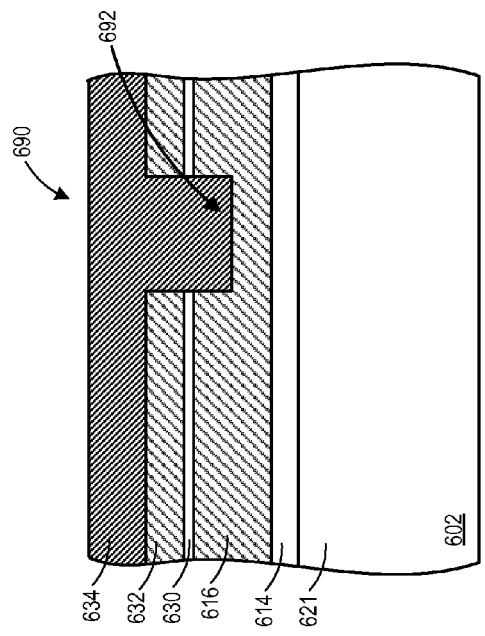
Figure 7C:
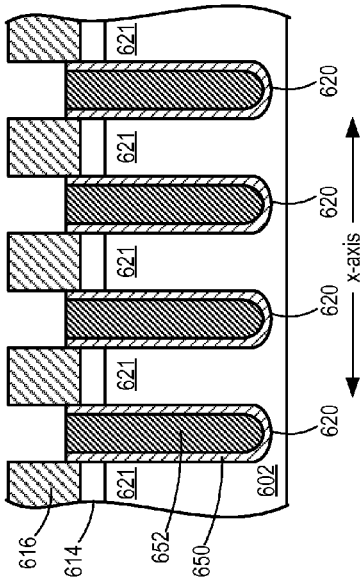

At step 510, a sacrificial film is formed in the isolation region and the spaces between adjacent layer stack columns. FIG. 7C depicts the results of step 510 in one embodiment. In this example, a trench liner 650 (e.g., HTO) is first formed along the vertical sidewalls and lower surface of the isolation regions. Different thicknesses of the liner may be used. In one example, the liner has a thickness of 4 nm or less. Then, the sacrificial material 652 is formed to complete filling of the isolation regions and spaces. In one embodiment, material 652 is a spin on dielectric (SOD) having a high etch selectivity with respect to the liner 650. In one example, the sacrificial film is a borosilicate glass (BSG) or other type of oxide. In another example, a spin-on-carbon can be used. Other materials can also be used such as polysilicon, silicon nitride (SiN) or an undensified polysilazane (PSZ) such as a PSZ-based inorganic spin-on-glass (SOG) material. The sacrificial film can be chosen for a high etch selectivity with respect to the liner so that it etches at a faster rate than the liner. A high etch selectivity of material 652 to material 650 can be achieved by skipping anneals. By not annealing sacrificial material 652, or by not annealing material 652 to the same degree as liner 650, a high etch selectivity between these layers may be obtained. In one example, a dielectric fill material can be formed to partially fill the trenches after forming the liner and before forming the sacrificial material. For example, the partial fill material may be formed so that its upper surface is between 50-100 nm below the substrate surface to define a lower endpoint for the bit line air gaps formed later.

After forming the sacrificial film, it and liner 650 are recessed to a depth below the level of the upper surface of the charge storage strips 616. A selective etch process can be applied to recess an oxide sacrificial material using the hard masking material as a mask. Recessing the sacrificial material such that its upper surface is lower than the level of the upper surface of the charge storage strips provides spaces between the charge storage strips. FIG. 7C further depicts the results of removing the hard masking strips 618.

Figure 7D:
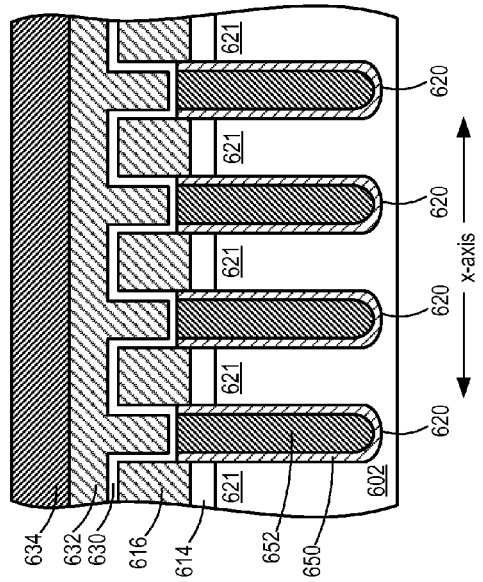

At step 512, an intermediate dielectric layer is formed, followed by one or more control gate layers. FIG. 7D depicts the results of step 512 in one example. An intermediate dielectric layer 630 is formed using a conformal deposition process so that it overlies the upper surface and sidewalls of charge storage strips 616, and the upper surface of the isolation regions, while leaving space between adjacent charge storage strips. The intermediate dielectric layer is a triple layer of oxide, nitride and oxide (ONO) in one embodiment. In one embodiment, a high-K (dielectric constant) material is used for the intermediate dielectric to reduce or eliminate charge transfer through the intermediate layer while providing enhanced control gate to floating gate coupling. The control gate layer includes protrusions that extend vertically toward the substrate surface between adjacent charge storage strips, separated by the conformal intermediate dielectric layer.

The control gate layer(s) includes at least one metal layer. In one embodiment, improved floating gate cell (e.g., NAND) scalability may be achieved by replacing a conventional polysilicon control gate with a poly-metal or all metal gate. A metal control gate can remove poly depletion issues that arise in the narrow space between floating gates associated with poly or poly/metal gates. As memory cells scale to smaller dimensions (e.g., beyond 2×nm), it becomes more difficult to use conventional poly processes to fill the region between floating gates.

In one example, the control gate has a lower portion that is formed from polysilicon and an upper portion that is formed from metal. In FIG. 7D, the control gate includes a first layer 632 formed from polysilicon and a second layer 634 formed from tungsten. A barrier layer may be formed between the polysilicon and the metal to prevent silicidation. In one embodiment, the control gate is entirely metal. The control gate layer can include, by way of example (from layers to upper layers as move away from substrate surface): a metal; a barrier metal and metal; a barrier metal, polysilicon and silicide; a barrier metal and silicide (e.g., fully-silicided polysilicon (FUSI)); polysilicon, a barrier metal and metal. Barrier metals may include, but are not limited to, titanium (Ti), titanium nitride (TiN), tungsten nitride (WN) and tantalum nitride (TaN) or a combination with related alloys that have a suitable electron work function. Metals may include, but are not limited to, tungsten (W), tungsten silicide (WSix) or other similar low resistivity metals. Silicides may include, but are not limited to, NiSi, CoSi. In one example, the control gate layer includes polysilicon that is subjected to silicidation after being etched into control gates so as to form a partially or fully-silicided (FUSI) control gate structures. The control gate layer may be formed by chemical vapor deposition (CVD), atomic layer deposition (ALD), plating, or other techniques.

FIG. 7D further demonstrates the results of processing after forming the first control gate layer 632, but prior to forming the second control gate layer 634, to etch through the first control gate layer and intermediate dielectric layer at an intended select gate region 690 of the memory array. An opening 692 is first formed, so that formation of control gate layer 634 fills the opening to connect the control gate layer(s) to the charge storage layer 604.

At step 514, a second pattern is formed over the layer stack. The second pattern is formed for etching orthogonal to the direction of etching using the first pattern. The second pattern may include strips of hard mask material and/or photoresist, or other suitable mask, that are elongated in the row direction along the x-axis with a spacing between strips in the column direction along the y-axis. The second pattern is used to etch the control gate layer into individual control gates and the charge storage strips into individual charge storage regions.

Figure 7E:
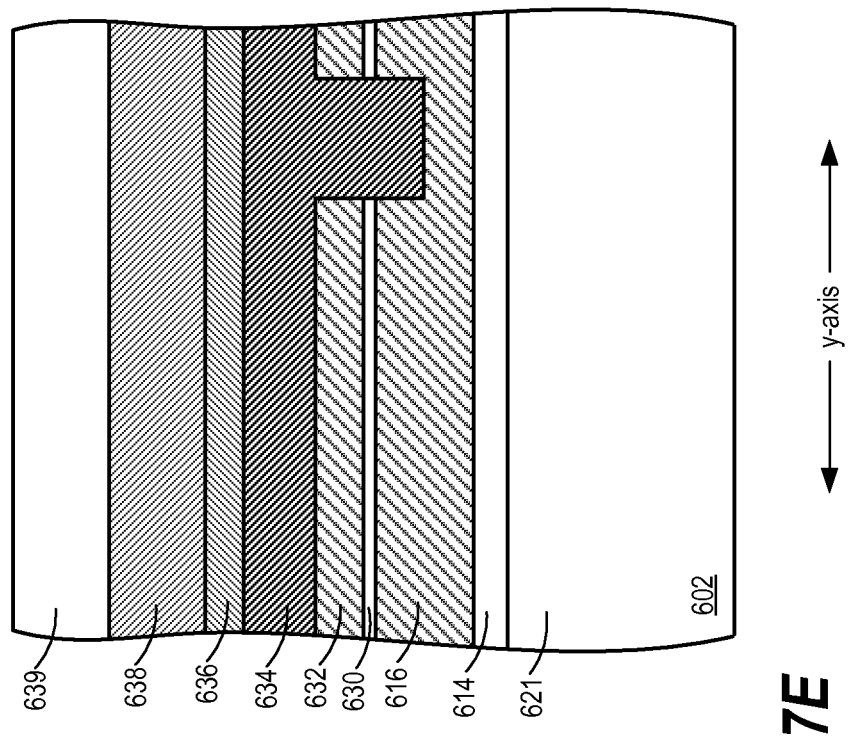
Figure 7E:
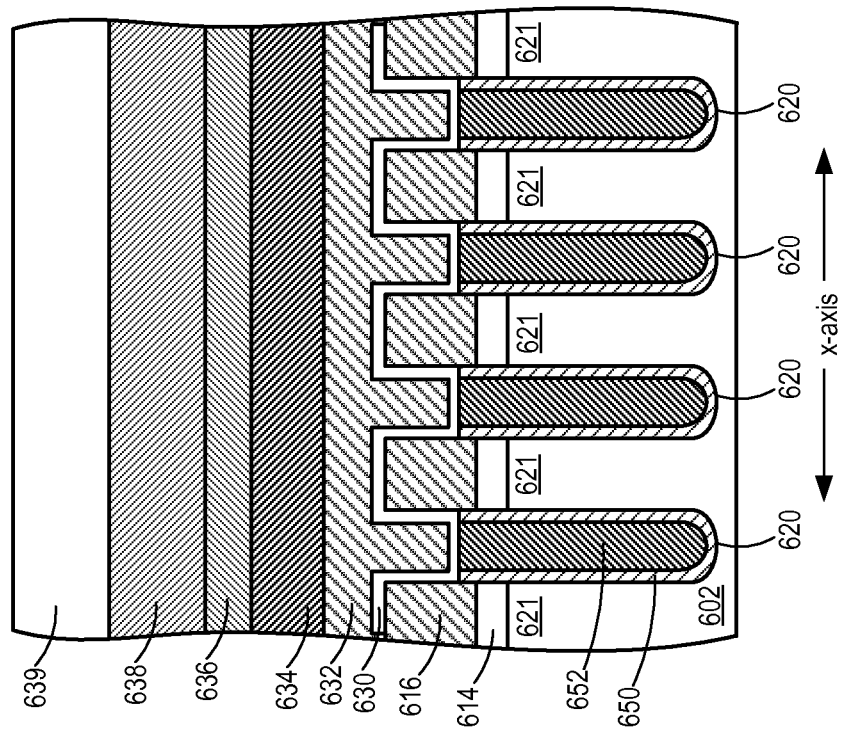
Figure 7F:
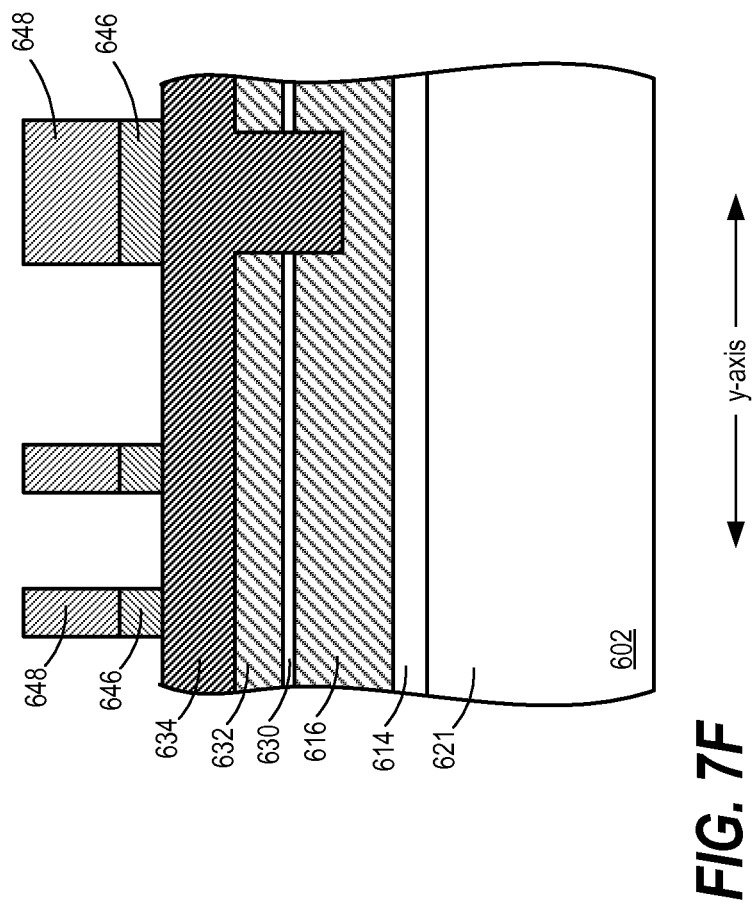
Figure 7F:
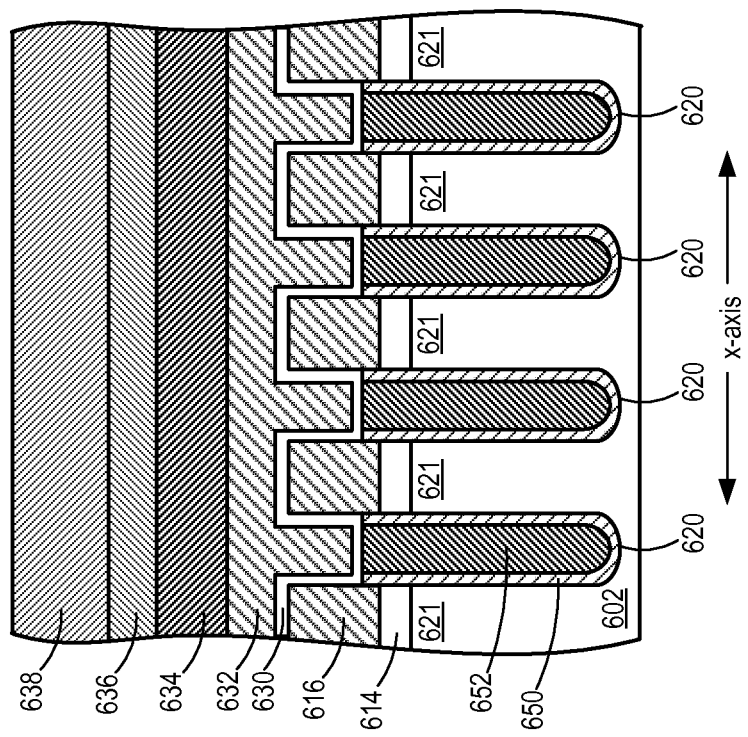

FIGS. 7E-7F depict processing to form a second pattern at step 514 in one embodiment. An adhesion or glue layer 636 is first formed to provide adhesion between the second control gate layer 634 and overlying layers. In one example, the adhesion layer is a nitride (e.g., SiN) formed in a low temperature ALD process or titanium formed in a CVD process. The adhesion layer may have a thickness of 5 nm thick in one example although other dimensions may be used. Over the adhesion layer is formed a pad layer (e.g., deposited SiN) 638 and one or more hard mask layers (e.g., TEOS) 639. Strips of photoresist or another patterning agent (polysilicon spacers) are then applied that are elongated in the x-axis direction with spaces therebetween in the y-axis direction. Etching is then preformed to form the structure shown in FIG. 7F. The photoresist or other agent may be used to etch layer 639 into a second pattern including pad strips 648 and adhesion strips 646.

Figure 7G:
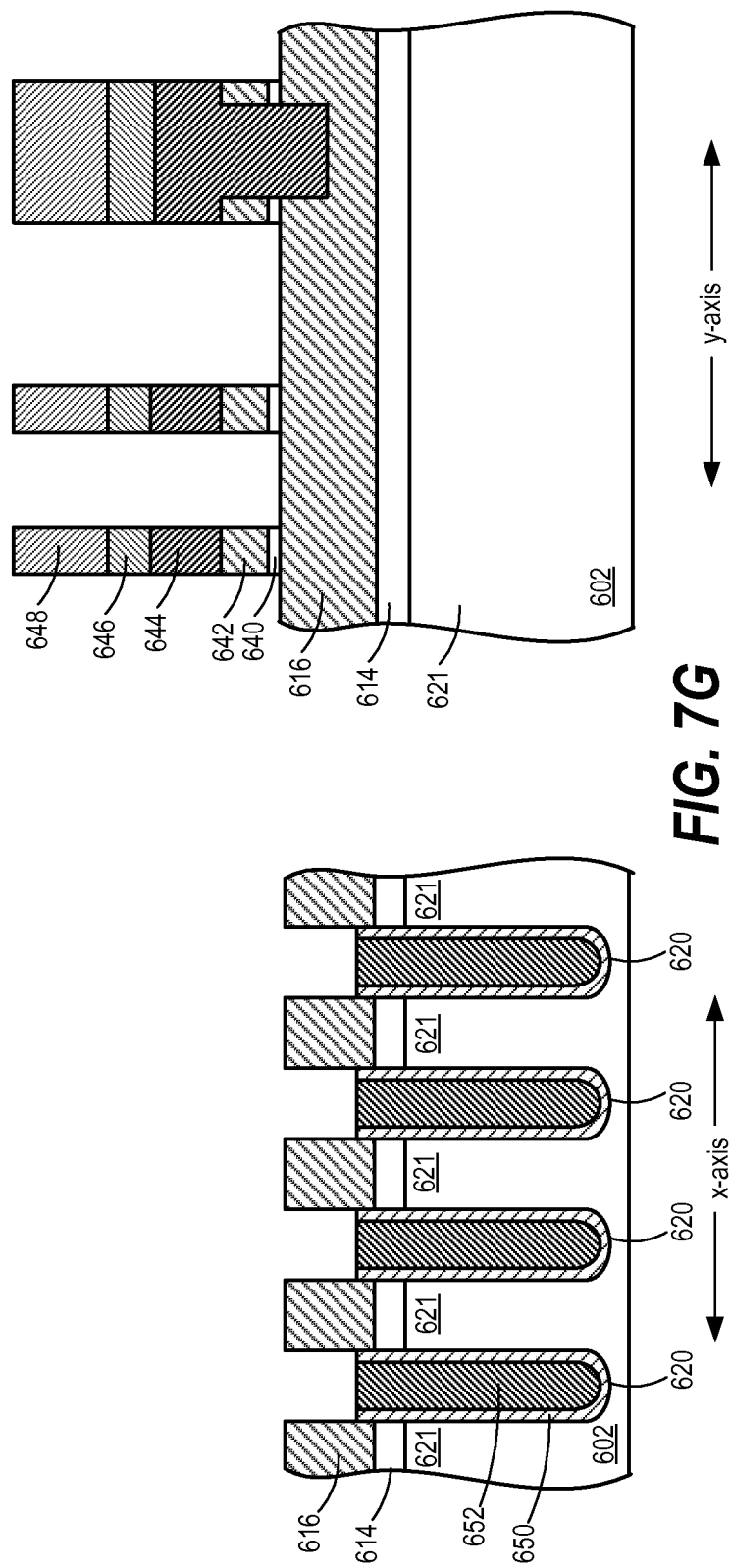

At step 516, the control gate layer(s) and intermediate dielectric layer are etched, orthogonal to the direction of etching at step 508. Etching forms rows of the control gate material and intermediate dielectric material that are elongated in the x-axis direction. FIG. 7G depicts the results of step 516 in one embodiment. In this example, the control gate layers 632 and 634 have been etched into strips 642 and 644, respectively. Together, these strips form individual control gates CG for the memory array. Etching proceeds in this example through the intermediate dielectric layer 630, forming intermediate dielectric strips 640. Etching at step 516 is controlled, by timing or other means, to stop before etching through the charge storage strips 616. Some portion of the charge storage strips may be etched due to the tolerances involved in such processes but etching does not proceed through the entire charge storage layer. In another example, etching may stop at the intermediate dielectric layer 630 or after etching through some portion of layer 630 before reaching the charge storage strips.

After etching the control gate layer(s) and intermediate dielectric layer, sidewall spacers are formed at step 518 along the vertical sidewalls of the layer stack rows formed at step 516. FIG. 7H depicts the results of step 518 in one example. Spacers 662 are formed along the sidewalls of each row, including the sidewalls of each intermediate dielectric strip 640, control gate strips 642 and 644, adhesion strips 646 and pad strips 648. In one example, the spacers are formed of nitride or oxide. A conformal deposition process may be used to deposit the spacer material and then etch it back to form spacers 662 as shown. In one example, the spacers have a dimension in the column direction of 2 nm or less, although other dimensions may be used.

Figure 7I:
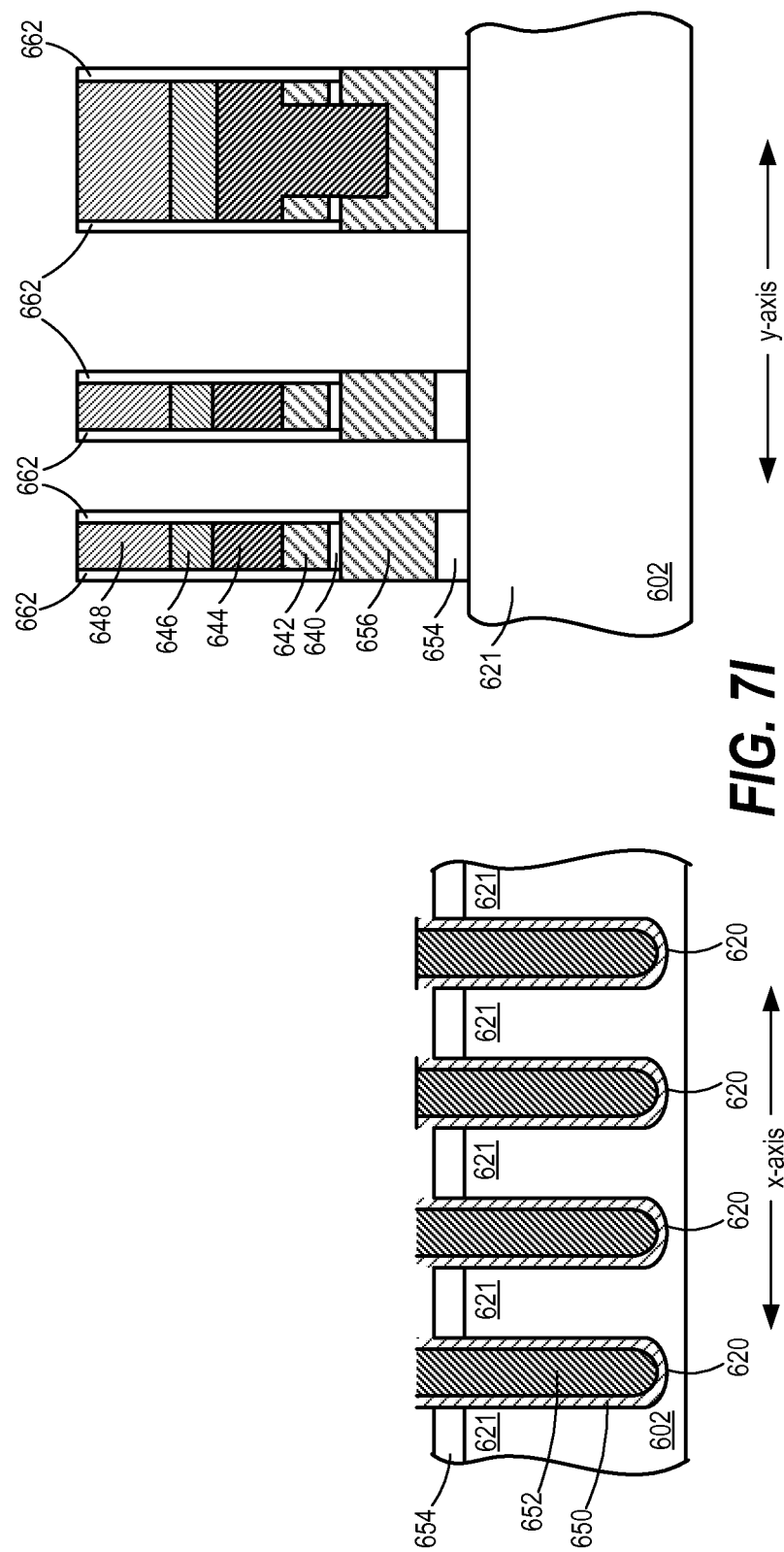

After forming the sidewall spacers, the strips of charge storage material are etched into individual charge storage regions at step 520. FIG. 7I depicts the results of step 520 in one embodiment. Etching charge storage strips 616 forms individual charge storage regions or floating gates 656. Etching continues until reaching the substrate surface in this example, also etching the tunnel dielectric strips into individual tunnel dielectric regions 654. In other examples, etching may stop at the tunnel dielectric strips 614. In another example, some portion of the tunnel dielectric layer is etched without completely etching through the layer. After etching the layer stack into rows an implant process can be performed to create n+ source/drain regions. In one embodiment, the n+ source/drain regions are created by implanting n-type dopants such as arsenic or phosphorus into the p-well.

Typically when fabricating non-volatile memory, a single etch process can be used to etch through the control gate layer(s) and the charge storage layers. Sidewall oxidation may then be applied, after etching both the control and charge storage layers, before further processing. In the present disclosure, however, etching the control gate layer(s) and the charge storage layer is separated so that sidewall spacers can be added to the etched strips of control gate material prior to etching the charge storage layer.

Common etch chemistries used to etch layer stacks for defining control gates and charge storage regions may cause deposition of metal byproducts such as those of a W control gate as in FIG. 7I on the charge storage material. Processes to remove these metal products from the charge storage regions can be time consuming and require high precision and accuracy, and in many cases, may attack the tunnel dielectric material and consequently degrade performance of the device.

Spacers 662, formed after etching the metal control gate material and prior to etching the charge storage material can help prevent sidewall deposition or contamination. This in turn reduces the need for aggressive cleans to remove any unwanted byproducts in later processes. These spacers also reduce or prevent oxidation of the metal control gates in later oxidation steps as may be applied to the charge storage region sidewalls. Furthermore, protecting the metal control gate material early in the process enables the use of FEOL tools, instead of dedicated tools to avoid metal cross-contamination. Protecting the metal layer also enables simpler wet cleans after etching the charge storage material.

The column dimension of each charge storage region is slimmed or decreased in the direction of the y-axis at step 524. As shown in FIG. 7I, spacers 662 cause etching of the charge storage strips to form charge storage regions 656 with wider column dimensions than the overlying intermediate dielectric regions 640 and control gates CG (642, 644). The smaller dimension of the charge storage regions may decrease coupling between them and the corresponding control gates. By slimming the column dimension of each charge storage region in the column direction, enhanced coupling can be achieved.

Figure 7J:
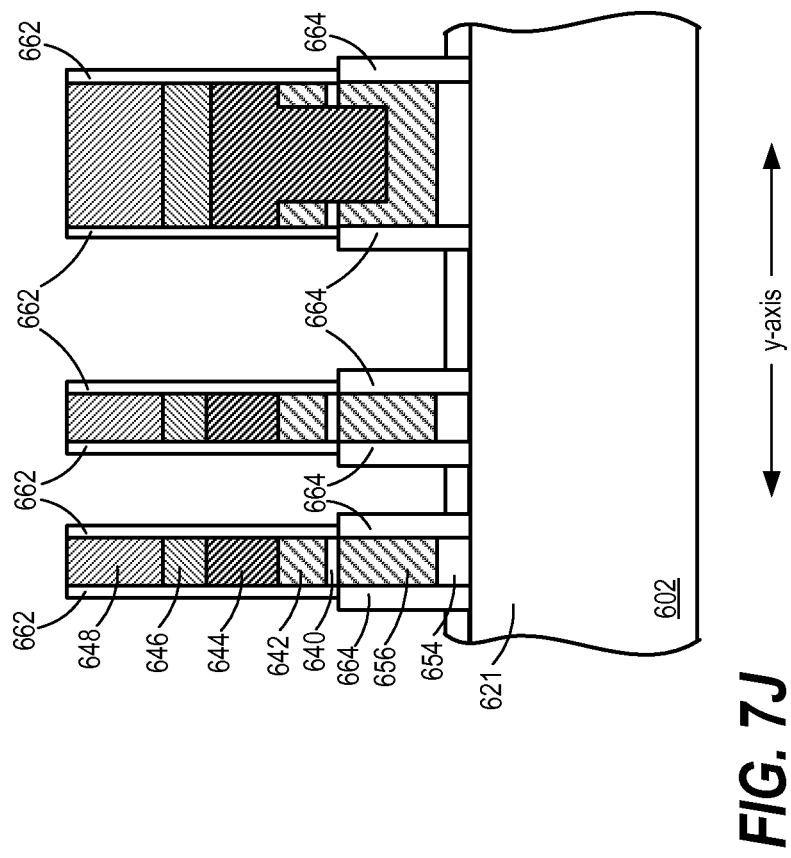
Figure 7J:
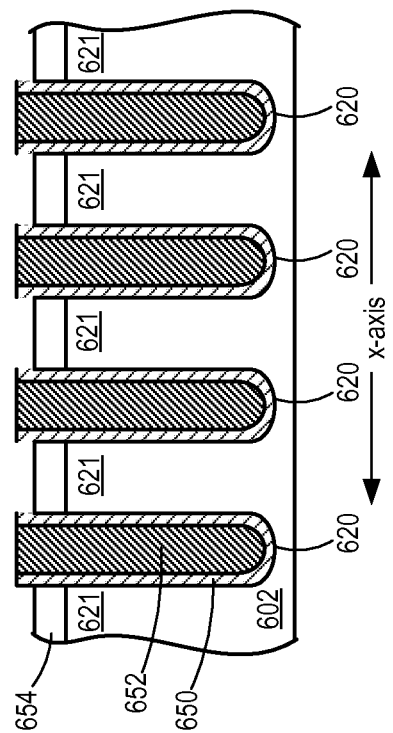

FIG. 7J depicts the results of step 524 in one embodiment. In this example, oxidation is performed to oxidize the sidewalls of the tunnel dielectric regions 654 and charge storage regions 656. Oxidation of the polysilicon charge storage regions consumes part of the polysilicon, beginning at the exposed surfaces, forming spacers 664 along the sidewalls of the charge storage regions. Accordingly, the dimension of the polysilicon decreases in the column direction to match that of the overlying layers. In other examples, the oxidation may form charge storage regions that still have column dimensions that are larger than those of the overlying layers, but smaller than before oxidation. In another example, the charge storage regions may have column dimensions that are less than the overlying layers.

Figure 8:
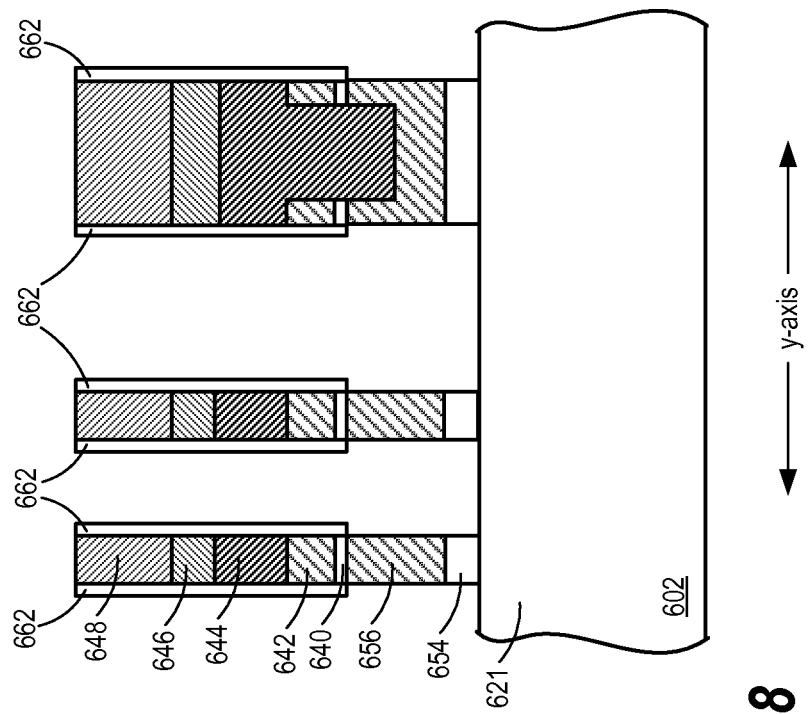
FIG. 8 is a cross-sectional view showing a charge storage slimming process in accordance with one embodiment.
Figure 8:
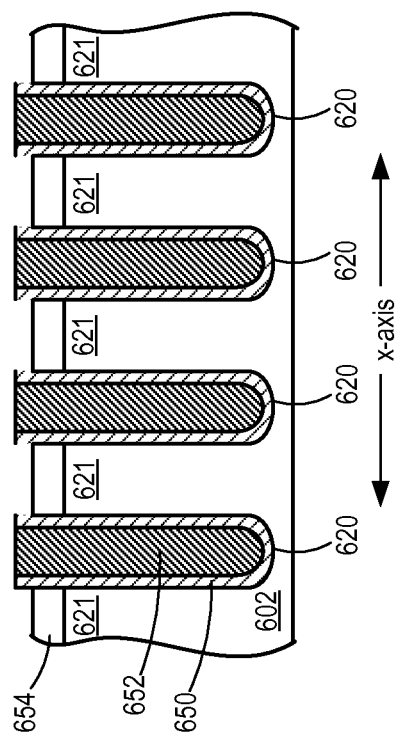

FIG. 8 depicts the results of step 524 in another embodiment that uses an etch process to slim the charge storage regions. Reactive ion or another suitable etch process selective to polysilicon is used to horizontally etch the charge storage regions and thus, slim their column dimension.

At step 526, the sacrificial material is removed to form bit line air gaps in the isolation regions. A wet etch process is used in one embodiment, although other suitable etch processes (e.g., dry) can be used. As earlier described, the etch process is selective for the sacrificial film so that it can be removed without removing the liner in the isolation regions and the sidewall spacers 662 on the layer stack rows.

Figure 7K:
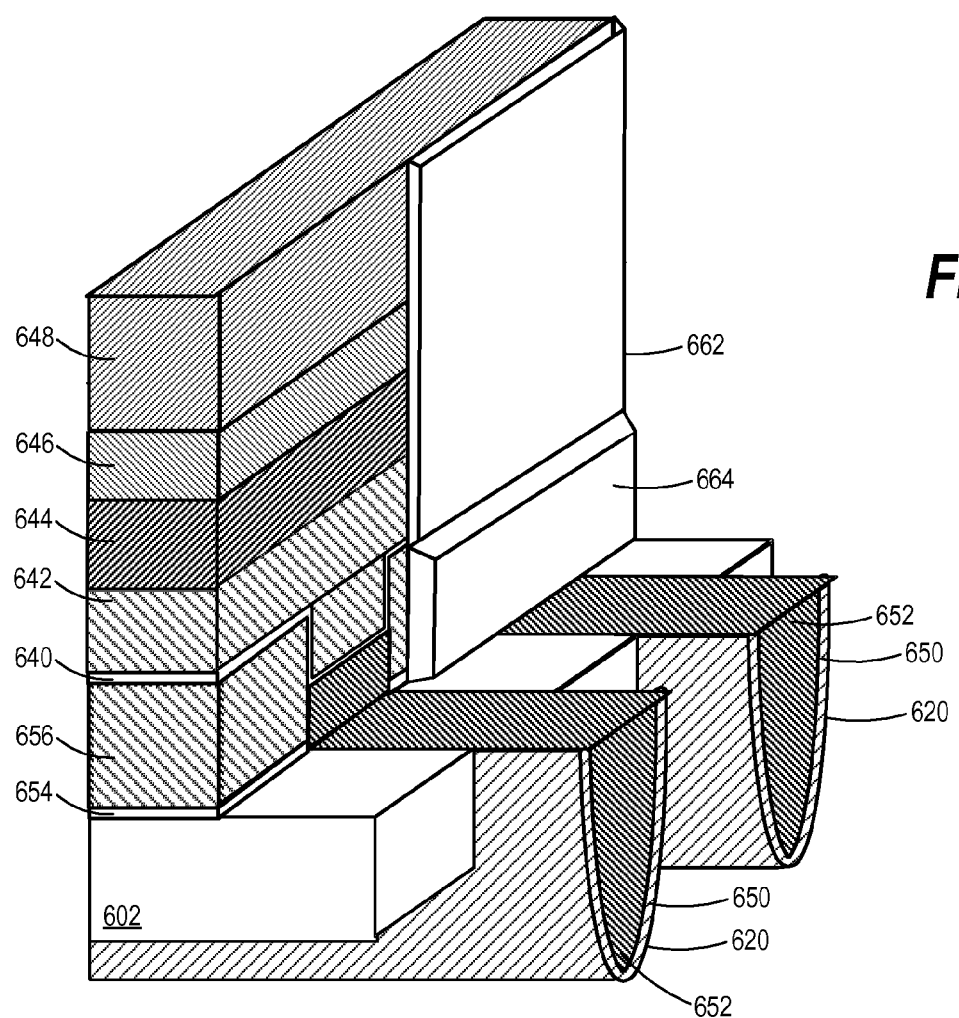
Figure 7L:
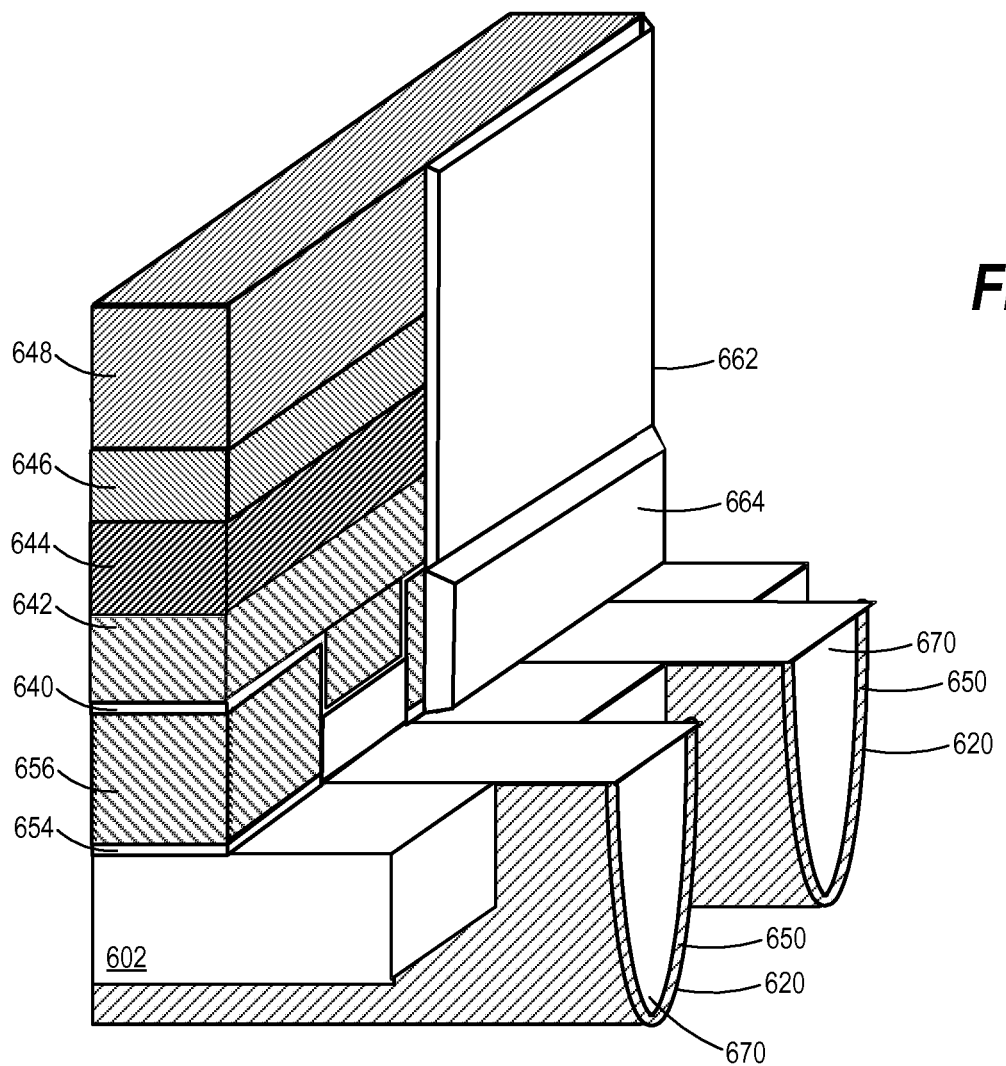

FIGS. 7K-7L are perspective views of the memory array, depicting the removal of the sacrificial material 650 from isolation regions 620 and the areas between layer stack columns. FIG. 7K corresponds to FIG. 7I, showing the array after forming sidewall spacers 662 along the intermediate dielectric regions and control gates, and after forming oxide spacers 664 along the sidewalls of the charge storage regions. In FIG. 7K, only a portion of each spacer is shown along the sidewalls for clarity so that the underlying process is not obfuscated.

As shown in FIG. 7L, etching removes the sacrificial film from the isolation regions, beginning with the material exposed between adjacent rows. Etching will also remove the sacrificial material in the isolation regions that underlies the layer stack rows. Etching will begin attacking the sacrificial material from the side under the rows after etching proceeds vertically down into the isolation regions. Etching will further continue behind the oxidized portion 664 of the charge storage regions 662 to remove portions of the sacrificial material that extend above the isolation regions and substrate surface. Etching removes the material between charge storage regions 656 and intermediate dielectric strips 640 that are adjacent in the word line or row direction. Some of the sacrificial material may not be removed. Thus, removing the sacrificial material does not necessarily have to include removing all of the material.

Removing the sacrificial material forms air gaps 670. The air gaps are elongated in the column direction in the isolation regions 620. The air gaps extend from below the surface of the substrate to the level of the lower surface of the intermediate dielectric strips 640. The air gaps may have different vertical dimensions in different embodiments. The air gaps may not extend as deep within the isolation regions and may not extend as far above the substrate surface. Further, the air gaps may be formed exclusively within the isolation regions or exclusively between adjacent layer stack columns in other examples.

At step 528 word line air gaps are formed at least partially in the spaces between the layer stack rows. The word line air gaps extend in the x-axis or row direction between adjacent layer stack rows to provide electrical isolation or shielding between elements of adjacent layer stack rows. The vertical dimension and column dimension (along y-axis) of the air gaps can vary to meet the particular requirements of a given implementation.

FIG. 7M depicts the results of step 520 in an example where a capping layer 672 is formed over the layer stack rows using a non-conformal deposition process. By using a non-conformal deposition process, material 672 will be deposited unequally at the upper portion of the layer stack rows. Material 672 quickly accumulates, meeting at a location over the space between rows to form word line air gaps 674. Material 672 extends vertically toward the substrate surface along spacers 662. In this example, material 672 extends along spacers 662 to a level between the upper surface and lower surface of cap strips 648. Because material 672 accumulates faster along spacers 662, the upper endpoint of air gap 674 extends above the level of the upper surface of both control gate strips 644 and 642. This distance for the air gap, extending above the control gate layers, decreases or eliminates any fringing fields.

In one embodiment, layer 672 is an oxide but other materials such as nitrides may used in other implementations. Although not shown, some portion of dielectric 672 may enter the space between charge storage regions. This portion of the dielectric may raise the lower endpoint of the air gap in the spaces between rows, but by only a small amount. However, a very non-conformal oxide will quickly grow together to seal off the spaces as shown without a substantial decrease in the vertical dimension of the air gap. Although referred to as "air" gaps, the elemental composition of the air can include many different materials. Thus, the term "air" should not be construed as having any particular elemental composition.

The air gaps are voids, where no solid material is formed. Any number and type of gases may be in the gaps 674. Although not shown, a polishing step can be applied to form individual caps from layer 672. The capping layer 672 can be polished to form plugs sealing the word line air gaps 674. A planar surface can be created for further processing steps.

If the charge storage regions are slimmed using an etch process as shown in FIG. 8, a dielectric liner can be formed along the exposed sidewalls of the charge storage regions (and also spacers 662) before forming the capping layer 672 for the word line air gaps. The dielectric liner may also be formed along the sidewalls of the rows (extending in the y-direction) that are exposed along the bit line air gaps 670.

At step 530, front end processing is completed. In one example, step 530 may include interconnecting the floating gate and control gate regions of select and peripheral circuitry transistors. Peripheral gate connections can be formed using vias or contact holes, etc. to form contacts to individual gate regions or to connect multiple transistors to a common control line. The select gate transistors can have their floating gate regions shorted to the control gate regions to form a single gate structure. Array connections can also be patterned and formed. After forming contacts, etc., further backend processing to form metal layers, etc. to complete the device according to known techniques can be performed. Various backend processes can be performed to finalize fabrication of the array. For example, a passivation dielectric layer can be deposited, followed by forming metal conductive lines and vias to connect the lines with source and drain regions at the end of the memory cell strings, etc.

Bit line air gaps 670 may be formed using other techniques. In one example, a standard dielectric fill material may be used at step 510 in place of the sacrificial material and step 526 can be omitted. The fill material may be recessed to a level below that of the substrate surface. Then a capping layer may be formed using a non-conformal deposition process similar to that used to form the word line air gaps. The capping layer overlies the isolation regions, forming bit line air gaps therein. After forming the bit line air gaps in this manner, processing can continue at step 512. In yet another example, bit line air gaps may not be formed. Step 510 may include forming a standard dielectric fill (e.g., oxide) material, which remains in the isolation regions throughout processing.

Figure 9E:
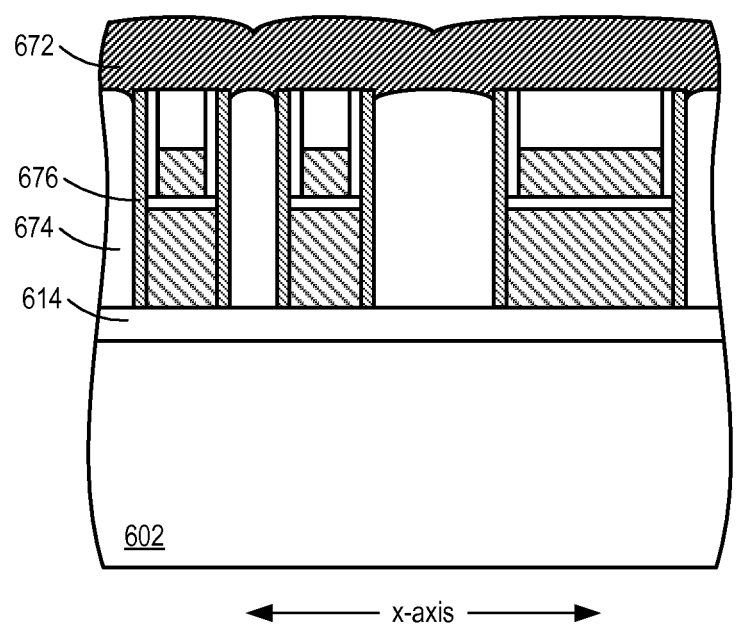

FIGS. 9A-9E are cross-sectional views depicting a set of processing steps that can be used to form a metal control gate directly on the intermediate dielectric layer in one embodiment. Processing first proceeds as shown in FIGS. 7A-7C. After forming and recessing the sacrificial material 650, the intermediate dielectric layer 630, a metal control gate layer 632, hard mask layer 638 and strips 637 of photoresist forming the second pattern are applied as shown in FIG. 9A. Control gate layer 632 is a metal such as tungsten, tungsten silicide (TiSix) or another low-resistivity metal. No layers such as a barrier metal or polysilicon layer are formed between the intermediate dielectric layer and the metal control gate layer 632 in this embodiment.

The hard mask layer 638 and control gate layer 632 are etched into strips 648 and 642, respectively, as shown in FIG. 9B. A dielectric layer 660 is then formed as shown in FIG. 9C. Layer 660 encapsulates the metal control gate layer and hard mask strips after etching, forming a sidewall liner before further processing. Conformal ALD or CVD processes are used in one example to form a SiN or SiO2 encapsulation film. Layer 660 is etched back as shown in FIG. 9D to form spacers 662. Spacers 662 may be formed by selectively etching the liner material. After etching back the spacers, the intermediate dielectric layer 630 is etched into strips 640 and the charge storage strips 646 are etched into charge storage regions 656 as shown in FIG. 9E. As earlier described, spacers 662 protect the tunnel dielectric material and charge storage material during etching and any subsequent cleans that are performed.

FIG. 9E further depicts the formation of a dielectric liner 676 which is applied after etching the charge storage regions. A capping layer 672 is then non-conformally deposited to define word line air gaps 674. Liner 676 is formed along the sidewalls of the spacers 662 and the sidewalls of the exposed charge storage regions 656.

In one embodiment, a direct etch process is applied to etch through the metal control gate layer(s) and charge storage layer in the same process without forming spacers. After etching the charge storage layer, a special clean process and oxidation is performed to clean the tunnel dielectric material and charge storage regions without damaging the tunnel dielectric material. A dilute chemistry that attacks metal or metal-polymer byproducts on the polysilicon charge storage material, but not a metal gate layer such as tungsten can be used.

Figure 10:
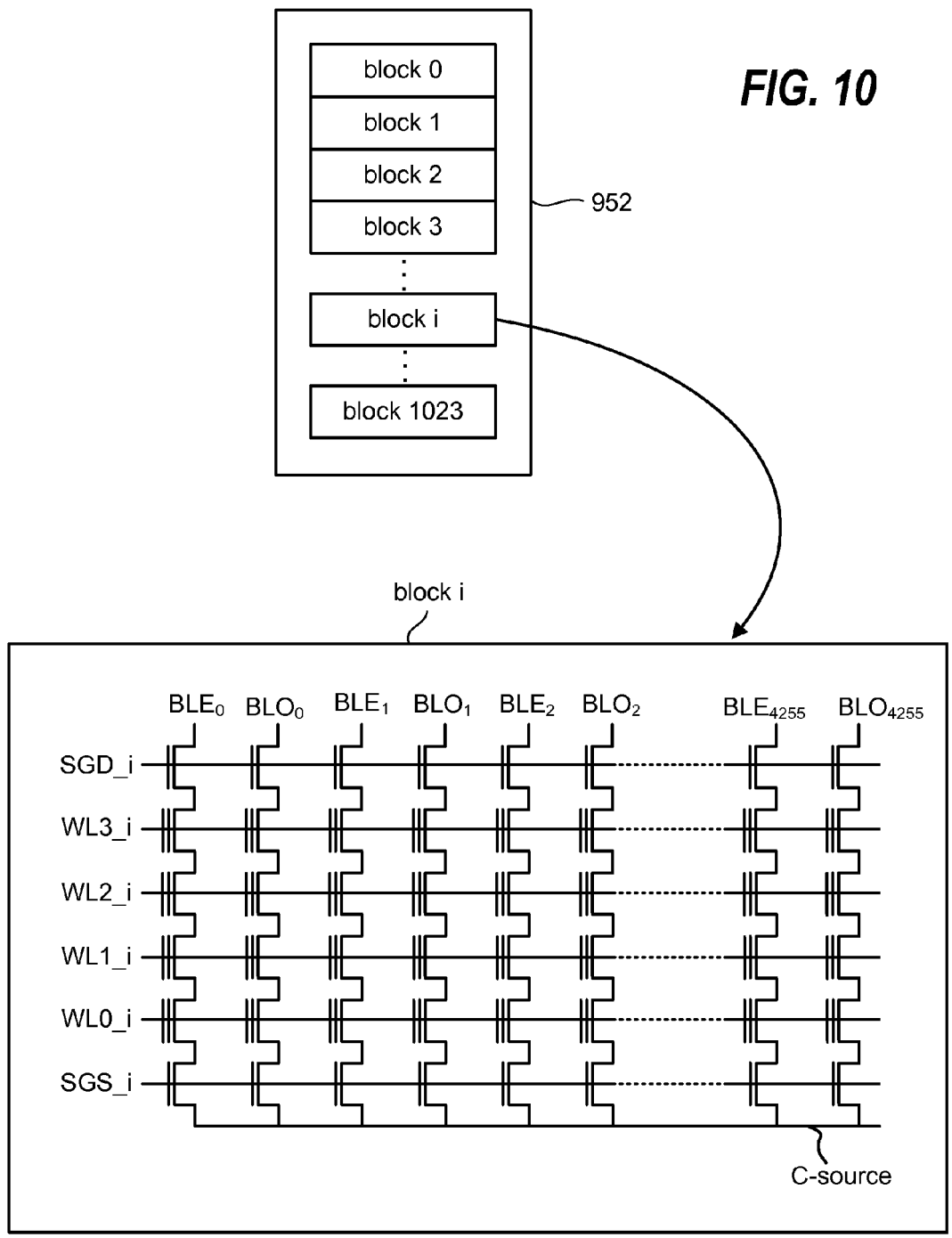
FIG. 10 depicts an example of the organization of a memory array in accordance with one embodiment.

FIG. 10 depicts an exemplary structure of a memory cell array 952 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 10 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-i), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 11:
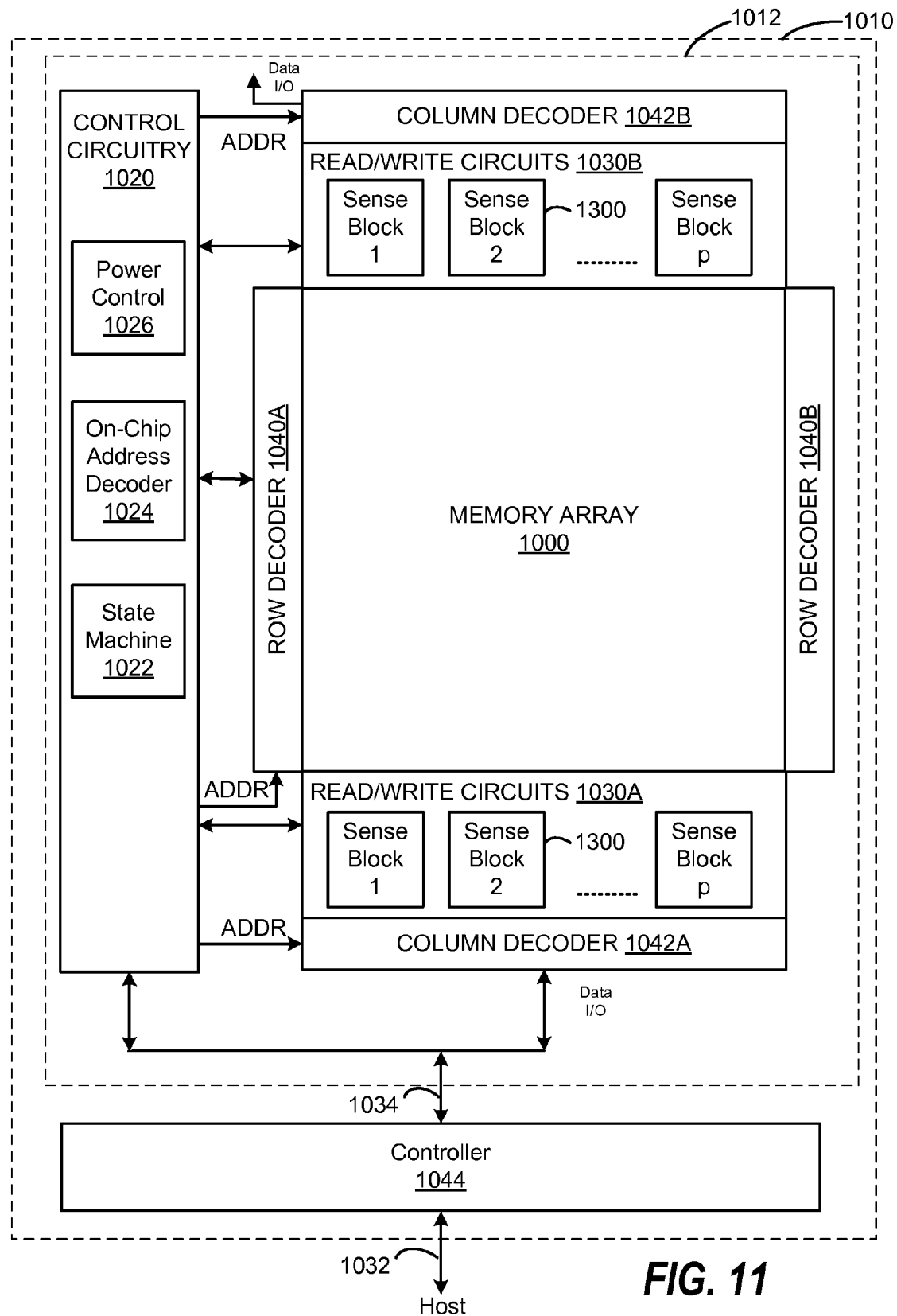
FIG. 11 is a block diagram depicting an example of a memory system that can be fabricated or used to implement embodiments of the disclosed technology.

FIG. 11 illustrates a non-volatile storage device 1010 that may include one or more memory die or chips 1012. Memory die 1012 includes an array (two-dimensional or three dimensional) of memory cells 1000, control circuitry 1020, and read/write circuits 1030A and 1030B. In one embodiment, access to the memory array 1000 by the various peripheral circuits is implemented in a symmetric fashion, on opposite sides of the array, so that the densities of access lines and circuitry on each side are reduced by half. The read/write circuits 1030A and 1030B include multiple sense blocks 1300 which allow a page of memory cells to be read or programmed in parallel. The memory array 1000 is addressable by word lines via row decoders 1040A and 1040B and by bit lines via column decoders 1042A and 1042B. In a typical embodiment, a controller 1044 is included in the same memory device 1010 (e.g., a removable storage card or package) as the one or more memory die 1012. Commands and data are transferred between the host and controller 1044 via lines 1032 and between the controller and the one or more memory die 1012 via lines 1034. One implementation can include multiple chips 1012.

Control circuitry 1020 cooperates with the read/write circuits 1030A and 1030B to perform memory operations on the memory array 1000. The control circuitry 1020 includes a state machine 1022, an on-chip address decoder 1024 and a power control module 1026. The state machine 1022 provides chip-level control of memory operations. The on-chip address decoder 1024 provides an address interface to convert between the address that is used by the host or a memory controller to the hardware address used by the decoders 1040A, 1040B, 1042A, and 1042B. The power control module 1026 controls the power and voltages supplied to the word lines and bit lines during memory operations. In one embodiment, power control module 1026 includes one or more charge pumps that can create voltages larger than the supply voltage.

In one embodiment, one or any combination of control circuitry 1020, power control circuit 1026, decoder circuit 1024, state machine circuit 1022, decoder circuit 1042A, decoder circuit 1042B, decoder circuit 1040A, decoder circuit 1040B, read/write circuits 1030A, read/write circuits 1030B, and/or controller 1044 can be referred to as one or more managing circuits.

Figure 12:
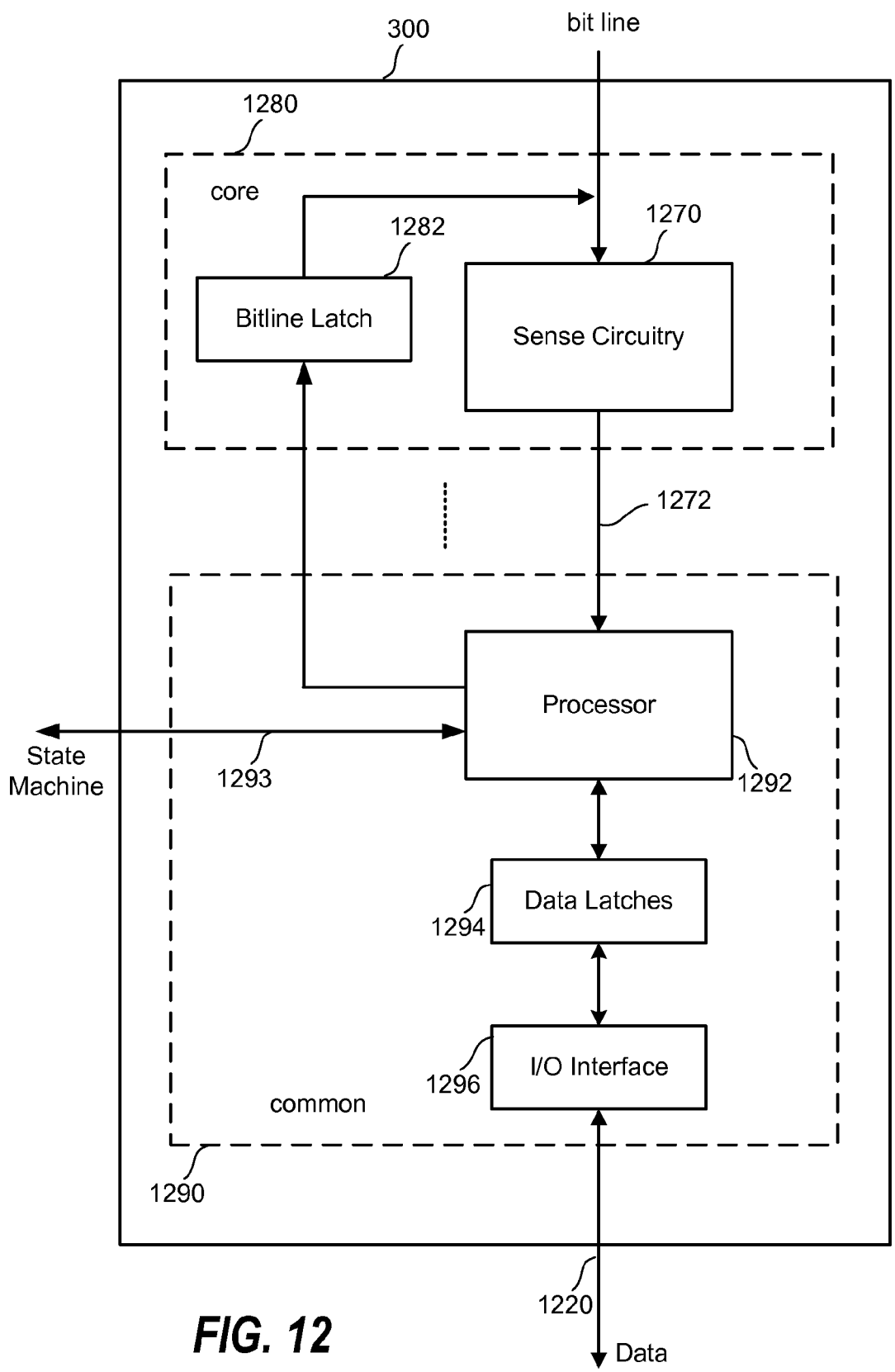
FIG. 12 is a block diagram depicting one embodiment of a sense block.

FIG. 12 is a block diagram of an individual sense block 1300 partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details, refer to U.S. Patent Application Publication 2006/0140007, which is incorporated herein by reference in its entirety.

Sense module 1280 comprises sense circuitry 1270 that determines whether a conduction current in a connected bit line is above or below a predetermined threshold level. In some embodiments, sense module 1280 includes a circuit commonly referred to as a sense amplifier. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., Vdd).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed memory cell and store the determined data in the set of data latches. The set of data latches 1294 is used to store data bits determined by processor 1292 during a read operation. It is also used to store data bits imported from the data bus 1220 during a program operation.

The imported data bits represent write data meant to be programmed into the memory. I/O interface 1296 provides an interface between data latches 1294 and the data bus 1220.

During read or sensing, the operation of the system is under the control of state machine 1022 that controls the supply of different control gate voltages to the addressed cell. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted in FIG. 12) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 1292 to accumulate the results of the associated bit lines such that the state machine need only read the wired-OR line one time.

During program or verify, the data to be programmed is stored in the set of data latches 1294 from the data bus 1220. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 1292 monitors the verified memory state relative to the desired memory state. When the two are in agreement, processor 1292 sets the bit line latch 1282 so as to cause the bit line to be pulled to a state designating program inhibit. This inhibits the cell coupled to the bit line from further programming even if it is subjected to programming pulses on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are 3-5 (or another number) data latches per sense module 1280. In one embodiment, the latches are each one bit. In some implementations (but not required), the data latches are implemented as a shift register so that the parallel data stored therein is converted to serial data for data bus 1220, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Various features and techniques have been presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

In an embodiment, a method of fabricating non-volatile storage is provided that includes etching at least one metal control gate layer into a plurality of control gates extending in a row direction over a surface of a substrate, where each control gate includes first and second sidewalls elongated in the row direction and that extend vertically with respect to the substrate surface. Sidewall spacers are formed along the first and second sidewalls of each control gate after etching the at least one metal control gate layer, followed by etching at least one charge storage layer into a plurality of charge storage regions after forming the sidewall spacers along the first and second sidewalls of each control gate. The column dimension of each charge storage region is reduced after etching the at least one charge storage layer and a plurality of air gaps is formed that includes an air gap between each pair of control gates adjacent in the column direction, where each air gap extends vertically with respect to the substrate surface.

In an embodiment, a method of fabricating non-volatile storage using a substrate is provided that includes forming a plurality of charge storage strips separated from a surface of the substrate by a plurality of tunnel dielectric strips, forming a metal control gate layer separated from the charge storage strips by an intermediate dielectric layer, etching the metal control gate layer into a plurality of control gates elongated in a row direction over the substrate surface, forming a plurality of sidewall spacers after etching the metal control gate layer that includes a sidewall spacer along a first and second sidewall of each control gate, etching the intermediate dielectric layer and the plurality of charge storage strips after forming the plurality of sidewalls spacers to form a row of charge storage regions from each charge storage strip, oxidizing a first and second sidewall of each charge storage region after etching the intermediate dielectric layer and the plurality of charge storage strips, and forming a plurality of air gaps including an air gap between each pair of control gates adjacent in the column direction.

In an embodiment, a non-volatile memory array is provided that includes a plurality of control gates extending in a row direction over a surface of a substrate. Each control gate includes first and second sidewalls elongated in the row direction and that extend vertically with respect to the substrate surface. A plurality of sidewall spacers are formed along the first and the second sidewalls of each control gate. The array includes a plurality of sets of charge storage regions. Each set of charge storage regions underlies a corresponding control gate and is separated from the corresponding control gate by an intermediate dielectric material. A plurality of air gaps are provided that includes an air gap between each pair of control gates adjacent in the column direction. Each air gap extends vertically with respect to the substrate surface.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A method of fabricating non-volatile storage, comprising:
    etching at least one metal control gate layer into a plurality of control gates extending in a row direction over a surface of a substrate, each control gate including first and second sidewalls elongated in the row direction and extending vertically with respect to the substrate surface;
    forming sidewall spacers along the first and second sidewalls of each control gate after etching the at least one metal control gate layer;
    etching at least one charge storage layer into a plurality of charge storage regions after forming the sidewall spacers along the first and second sidewalls of each control gate;
    reducing a column dimension of each charge storage region after etching the at least one charge storage layer; and
    forming a plurality of air gaps including an air gap between each pair of control gates adjacent in the column direction, each air gap extending vertically with respect to the substrate surface.

2. A method according to claim 1, wherein:
    etching the at least one metal control gate layer and the at least one charge storage layer forms a plurality of layer stack rows including a first layer stack row and a second layer stack row;
    the first layer stack row includes a first control gate, a first intermediate dielectric strip and a first plurality of charge storage regions; and
    the second layer stack row includes a second control gate, a second intermediate dielectric strip, and a second plurality of charge storage regions.

3. A method according to claim 2, further comprising:
    non-conformally depositing a cap layer over the first layer stack row and the second layer stack row, the cap layer overlying air between a first spacer on a first sidewall of the first control gate and a second spacer on a second sidewall of the second control gate to form a first air gap between the first layer stack row and the second layer stack row.

4. A method according to claim 1, wherein the plurality of air gaps is a plurality of word line air gaps and the method further comprises, prior to forming the at least one metal control gate layer:
    forming a layer stack over the substrate including the at least one charge storage layer and a tunnel dielectric layer;
    etching the layer stack into a first layer stack column and a second layer stack column, the first layer stack column including a first charge storage strip and a first tunnel dielectric strip and the second layer stack column including a second charge storage strip and a second tunnel dielectric strip;
    etching the substrate to form an isolation region between a first active area underlying the first layer stack column and a second active area underlying the second layer stack column; and
    at least partially filling the isolation region with a sacrificial material;
    wherein etching the at least one charge storage layer includes etching the first charge storage strip into a first column of charge storage regions and etching the second charge storage strip into a second column of charge storage regions.

5. A method according to claim 4, further comprising:
    removing at least a portion of the sacrificial material after etching the first charge storage strip and the second charge storage strip, wherein removing the sacrificial material forms a bit line air gap in the isolation region.

6. A method according to claim 5, wherein:
    the first column of charge storage regions includes a first NAND string and the second column of charge storage regions includes a second NAND string.

7. A method of fabricating non-volatile storage according to claim 1, wherein reducing a column dimension of each charge storage region includes horizontally etching each charge storage region to reduce the column dimension.

8. A method of fabricating non-volatile storage according to claim 7, wherein reducing a column dimension of each charge storage region includes oxidizing each charge storage region to consume at least a portion of the charge storage region.

9. A method according to claim 1, further comprising:
    forming at least one polysilicon control gate layer; and
    forming the at least one metal control gate layer over and in electrical contact with the polysilicon control gate layer;
    wherein etching the at least one metal control gate layer includes etching the at least one polysilicon control gate layer, each control gate including a strip of the metal control gate layer and a strip of the polysilicon control gate layer.

10. A method according to claim 9, further comprising:
    forming an adhesion layer over the at least one metal control gate layer; and
    forming a pad layer over the adhesion layer;
    wherein etching the at least one metal control gate layer includes etching the adhesion layer into a plurality of adhesion strips and the pad layer into a plurality of pad strips, each adhesion strip and pad strip overlying a corresponding control gate.

11. A method of fabricating non-volatile storage using a substrate, comprising:
    forming a plurality of charge storage strips separated from a surface of the substrate by a plurality of tunnel dielectric strips;

forming a metal control gate layer separated from the charge storage strips by an intermediate dielectric layer;

etching the metal control gate layer into a plurality of control gates, each control gate elongated in a row direction over the substrate surface;

forming a plurality of sidewall spacers after etching the metal control gate layer, the plurality of sidewall spacers including a sidewall spacer along a first and second sidewall of each control gate;

etching the intermediate dielectric layer and the plurality of charge storage strips after forming the plurality of sidewalls spacers, wherein etching forms a row of charge storage regions from each charge storage strip;

oxidizing a first and second sidewall of each charge storage region after etching the intermediate dielectric layer and the plurality of charge storage strips; and forming a plurality of air gaps including an air gap between each pair of control gates adjacent in the column direction.

12. A method according to claim 11, wherein oxidizing includes oxidizing a first and a second sidewall of each sidewall spacer.

13. A method according to claim 11, wherein:

etching the control gate layer, the intermediate dielectric layer and the plurality of charge storage strips forms a plurality of layer stack rows including a first layer stack row and a second layer stack row;

the first layer stack row includes a first control gate, a first intermediate dielectric strip and a first plurality of charge storage regions; and the second layer stack row includes a second control gate, a second intermediate dielectric strip, and a second plurality of charge storage regions.

14. A method according to claim 13, further comprising:

forming a plurality of word line air gaps including a first word line air gap formed between the first layer stack row and the second layer stack row.

15. A method according to claim 14, wherein:

the first word line air gap extends vertically, with respect to the substrate surface, from a level above the substrate surface to at least a level of an upper surface of the first and second control gate.

\* \* \* \* \*